(12) United States Patent
Makala et al.

(10) Patent No.: US 11,903,218 B2
(45) Date of Patent: Feb. 13, 2024

(54) BONDED MEMORY DEVICES AND METHODS OF MAKING THE SAME

(71) Applicant: SANDISK TECHNOLOGIES LLC, Addison, TX (US)

(72) Inventors: Raghuveer S. Makala, Campbell, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 189 days.

(21) Appl. No.: 16/913,717

(22) Filed: Jun. 26, 2020

(65) Prior Publication Data

US 2021/0408019 A1    Dec. 30, 2021

(51) Int. Cl.
*H10B 53/30* (2023.01)
*H10B 61/00* (2023.01)
*H10B 63/00* (2023.01)
*H10N 50/01* (2023.01)
*H10N 70/00* (2023.01)

(52) U.S. Cl.
CPC ............ *H10B 53/30* (2023.02); *H10B 61/10* (2023.02); *H10B 63/24* (2023.02); *H10B 63/80* (2023.02); *H10N 50/01* (2023.02); *H10N 70/011* (2023.02)

(58) Field of Classification Search
CPC ........... H01L 29/516; H01L 2924/1441; H01L 21/02591; H01L 2924/05491
See application file for complete search history.

(56) References Cited

U.S. PATENT DOCUMENTS

| | | | |
|---|---|---|---|
| 5,393,352 A * | 2/1995 | Summerfelt | H01L 28/56 257/E21.01 |
| 5,915,167 A | 6/1999 | Leedy | |
| 6,198,652 B1 * | 3/2001 | Kawakubo | H10B 53/00 257/295 |
| 6,246,085 B1 * | 6/2001 | Yoshida | H01L 21/76831 257/E21.011 |
| 9,941,299 B1 | 4/2018 | Chen et al. | |
| 10,115,897 B1 | 10/2018 | Sato | |
| 10,121,965 B1 | 11/2018 | Uno et al. | |

(Continued)

FOREIGN PATENT DOCUMENTS

| | | |
|---|---|---|
| JP | 11-220103 A | 8/1999 |
| JP | 2014-229758 A | 12/2014 |

(Continued)

OTHER PUBLICATIONS

Chanthbouala, A. et al., "Solid-state memories based on ferroelectric tunnel junctions," Nature Nanotechnology, vol. 7, pp. 101-104, Feb. 2012, www.nature.com/naturenanotechnology, (2012).

(Continued)

*Primary Examiner* — Amar Movva
(74) *Attorney, Agent, or Firm* — THE MARBURY LAW GROUP PLLC

(57) ABSTRACT

At least a portion of a memory cell is formed over a first substrate and at least a portion of a steering element or word or bit line of the memory cell is formed over a second substrate. The at least a portion of the memory cell is bonded to at least a portion of a steering element or word or bit line. At least one of the first or second substrate may be removed after the bonding.

14 Claims, 32 Drawing Sheets

(56) References Cited

U.S. PATENT DOCUMENTS

| | | | |
|---|---|---|---|
| 10,199,434 | B1 | 2/2019 | Lee et al. |
| 10,224,372 | B2 | 3/2019 | Mori |
| 10,249,683 | B1 | 4/2019 | Lille et al. |
| 10,256,272 | B2 | 4/2019 | Yoshida et al. |
| 10,283,710 | B2 | 5/2019 | Kikuchi et al. |
| 10,354,728 | B2 | 7/2019 | Rajamohanan et al. |
| 10,381,409 | B1 | 8/2019 | Zhou et al. |
| 10,381,411 | B2 | 8/2019 | Lille |
| 10,381,559 | B1 | 8/2019 | Zhou et al. |
| 2006/0091437 | A1 | 5/2006 | Tong et al. |
| 2007/0107774 | A1 | 5/2007 | Jin et al. |
| 2009/0147392 | A1 | 6/2009 | Prejbeanu et al. |
| 2016/0005461 | A1* | 1/2016 | Jo ................. G11C 13/0061 365/148 |
| 2016/0064391 | A1 | 3/2016 | Li et al. |
| 2016/0359109 | A1* | 12/2016 | Kamimuta ........... H10N 70/063 |
| 2016/0365133 | A1* | 12/2016 | Ino ..................... G11C 11/221 |
| 2016/0380185 | A1 | 12/2016 | Kato et al. |
| 2017/0069841 | A1 | 3/2017 | Ino et al. |
| 2018/0277517 | A1 | 9/2018 | Kim et al. |
| 2018/0342557 | A1 | 11/2018 | Mori |
| 2018/0358410 | A1 | 12/2018 | Lee |
| 2018/0374899 | A1 | 12/2018 | Yoshida et al. |
| 2019/0074441 | A1 | 3/2019 | Kikuchi et al. |
| 2019/0088664 | A1 | 3/2019 | Kabuyanagi et al. |
| 2019/0148286 | A1* | 5/2019 | Or-Bach ........... H01L 27/11582 257/315 |
| 2019/0189688 | A1 | 6/2019 | Lille |
| 2019/0287599 | A1 | 9/2019 | Higashi et al. |
| 2019/0288192 | A1 | 9/2019 | Takahashi et al. |
| 2019/0354843 | A1 | 11/2019 | Park et al. |
| 2019/0363179 | A1 | 11/2019 | Or-Bach et al. |
| 2020/0119259 | A1 | 4/2020 | Ahn et al. |

FOREIGN PATENT DOCUMENTS

| | | | |
|---|---|---|---|
| KR | 10-2018-0137580 A | | 12/2018 |
| WO | WO2009/031387 A1 | | 3/2009 |

OTHER PUBLICATIONS

Benjamin, S. L. et al., "Controlling the nanostructure of bismuth telluride by selective chemical vapour deposition from a single source precursor," J. Mater. Chem. A, 2014, vol. 2, pp. 4865-4869, (2014).

Goh, Y. et al., "Enhanced tunneling electroresistance effects in HfZrO-based ferroelectric tunnel junctions by high-pressure nitrogen annealing," Appl. Phys. Lett., vol. 113, pp. 052905-1-052905-5 (2018); doi: 10.1063/1.5040031, (2018).

Garcia, V. et al., "Ferroelectric tunnel junctions for information storage and processing," Nature Communications, Nature Communications | 5:4289 | DOI: 10.1038/ncomms5289, www.nature.com/naturecommunications, (2014).

Garcia, V. et al., "Giant tunnel electroresistance for non-destructive readout of ferroelectric states," Nature, vol. 460, Jul. 2, 2009, pp. 81-84, doi:10.1038/nature08128, (2009).

Xi, Z. et al., "Giant tunneling electroresistance in metal/ferroelectric/semiconductor tunnel junctions by engineering the Schottky barrier," Nature Communications, vol. 8:15217, pp. 1-9, DOI: 10.1038/ncomms15217, (2016).

De Groot, C. H. et al., "Highly Selective Chemical Vapor Deposition of Tin Diselenide Thin Films onto Patterned Substrates via Single Source Diselenoether Precursors," Chem. Mater. 2012, vol. 24, pp. 4442-4449, (2012).

Wen, Z. et al., "Ferroelectric-field-effect-enhanced electroresistance in metal / ferroelectric / semiconductor tunnel junctions," Nature Materials, vol. 12, pp. 617-621 (2013).

Li, J. et al., "Ultrafast polarization switching in thin-film ferroelectrics," Applied Physics Letters, vol. 84, No. 7, pp. 1174-1176 (2004).

Deguet, C. et al., "Germanium-On-Insulator (GeOI) Structures Realized by the Smart Cut Technology," 2004 IEEE International SOI conference, 10/04, 2 pages, (2004).

Lomenzo, P. D. et al., "Ferroelectric Si-Doped HfO2 Device Properties on Highly Doped Germanium," IEEE Electron Deice Letters, vol. 36, No. 8, pp. 766-768, (2015).

Geiger, R. et al., "Uniaxially stressed germanium with fundamental direct band gap" Cond. Mat. Matl. Sci., 9 pages, (2015).

Li, T. et al., "Origin of Ferroelectricity in Epitaxial Si-Doped HfO2 Films" ACS Appl. Mater. Interfaces 2019, vol. 11, pp. 4139-4144, (2019).

Tian, X. et al., "Evolution of ferroelectric HfO2 in ultrathin region down to 3 nm" Appl. Phys. Lett. 112, 102902 (2018); https://doi.org/10.1063/1.5017094.

Fan, Z. et al., "Ferroelectric HfO2-based materials for next-generation ferroelectric memories" Journal of Advanced Dielectrics, vol. 6, No. 2 (2016) 1630003 (11 pages).

U.S. Appl. No. 16/138,001, filed Sep. 21, 2018, SanDisk Technologies LLC.

U.S. Appl. No. 16/227,889, filed Dec. 20, 2018, SanDisk Technologies LLC.

U.S. Appl. No. 16/249,300, filed Jan. 16, 2019, SanDisk Technologies LLC.

U.S. Appl. No. 16/291,673, filed Mar. 3, 2019, SanDisk Technologies LLC.

U.S. Appl. No. 16/374,330, filed Apr. 3, 2019, SanDisk Technologies LLC.

U.S. Appl. No. 16/412,764, filed May 15, 2019, SanDisk Technologies LLC.

U.S. Appl. No. 16/440,250, filed Jun. 13, 2019, SanDisk Technologies LLC.

U.S. Appl. No. 16/440,378, filed Jun. 13, 2019, SanDisk Technologies LLC.

U.S. Appl. No. 16/454,458, filed Jun. 27, 2019, SanDisk Technologies LLC.

U.S. Appl. No. 16/454,475, filed Jun. 27, 2019, SanDisk Technologies LLC.

U.S. Appl. No. 16/456,736, filed Jun. 28, 2019, SanDisk Technologies LLC.

U.S. Appl. No. 16/457,687, filed Jun. 28, 2019, SanDisk Technologies LLC.

U.S. Appl. No. 16/457,721, filed Jun. 28, 2019, SanDisk Technologies LLC.

U.S. Appl. No. 16/530,256, filed Aug. 2, 2019, SanDisk Technologies LLC.

U.S. Appl. No. 16/541,289, filed Aug. 15, 2019, SanDisk Technologies LLC.

U.S. Appl. No. 16/568,668, filed Sep. 12, 2019, SanDisk Technologies LLC.

U.S. Appl. No. 16/577,176, filed Sep. 20, 2019, SanDisk Technologies LLC.

U.S. Appl. No. 16/694,340, filed Nov. 25, 2019, SanDisk Technologies LLC.

U.S. Appl. No. 16/737,088, filed Jan. 8, 2020, SanDisk Technologies LLC.

U.S. Appl. No. 16/910,799, filed Jun. 24, 2020, SanDisk Technologies LLC.

Uhrmann, T., "Advances in Heterogeneous Integration Through Wafer Bonding," Mar. 3, 2015, https://www.3dincites.com/2015/03/advances-heterogeneous-integration-wafer-bonding/.

Yakushiji, K. et al., "Fabrication of a reversal stacking of a magnetic tunnel junction by wafer bonding and thinning technique," Magnetics Society of Japan 2016 conference proceedings 6aA-7 (2016) p. 58, https://www.magnetics.jp/kouenkai/2016/doc/program/6aA-7.pdf.

Yakushiji, K. et al., "Further Technologies for STT-MRAM," Session C4, Proceeding of the 28th Magnetic Recording Conference (TMRC 2017), Aug. 2-4, 2017 Tsukuba, Japan. https://www.nims.go.jp/mmu/tmrc2017/att/C4.pdf.

Makala, R. S. et al., "Bonded Memory Devices and Methods of Making the Same," U.S. Appl. No. 16/913,766, filed Jun. 26, 2020.

(56) References Cited

OTHER PUBLICATIONS

Notification of Transmittal of the International Search Report and the Written Opinion of the International Searching Authority for International Patent Application No. PCTUS2020/067428, dated Apr. 29, 2021, 11 pages.
USPTO Office Communication, Non-Final Office Action for U.S. Appl. No. 16/913,766, dated May 11, 2022, 26 pages.
EPO Office Communication, Supplemental European Search Report and Provisional Opinion Accompanying the Partial Search Result for European Patent Application No. 20942180.9, dated Oct. 10, 2023, 12 pages.
KIPO Office Communication, Notice of Preliminary Rejection for Korean Patent Application No. 10-2022-7017454, dated Oct. 23, 2023, 16 pages.

* cited by examiner

BONDED MEMORY DEVICES AND METHODS OF MAKING THE SAME

FIELD

The present disclosure relates generally to the field of memory devices and specifically to bonded memory devices and methods of making the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material. A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

SUMMARY

According to an aspect of the present disclosure, a memory device comprises a first electrically conductive line laterally extending along a first horizontal direction, a memory pillar structure overlying and contacting the first electrically conductive line, wherein the memory pillar structure comprises a single crystalline ferroelectric material plate in which an entirety of a ferroelectric material is single crystalline, and a second electrically conductive line laterally extending along a second horizontal direction and overlying and contacting the memory pillar structure.

According to another aspect of the present disclosure, a method of forming a memory device comprises providing a first substrate with a single crystalline semiconductor layer therein or thereupon, epitaxially growing a single crystalline ferroelectric material layer on the single crystalline semiconductor layer, forming a first metallic material layer on the single crystalline ferroelectric material layer to form a first layer stack comprising at least the single crystalline ferroelectric material layer and the first metallic material layer, forming a second layer stack comprising a selector material layer and a second metallic material layer over a second substrate, and bonding the second layer stack to the first layer stack.

According to another embodiment, a method of forming a memory device comprises providing a first assembly comprising a first substrate containing first electrically conductive lines comprising word lines or bit lines, forming at least a portion of a memory cell over the first electrically conductive lines, providing a second assembly comprising a second substrate containing second electrically conductive lines comprising other ones of word lines or bit lines; and bonding the first assembly to the second assembly such that the memory cell is located between the first electrically conductive lines and the second electrically conductive lines. One of the first electrically conductive lines comprises a word line or bit line of the memory cell and one of the second electrically conductive lines comprises the other one of the word line or bit line of the memory cell.

According to another embodiment, a method of forming a memory device comprises providing a first assembly comprising at least a portion of a memory cell located over a first substrate, providing a second assembly comprising at least a portion of a selector element located over a second substrate, and bonding the first assembly to the second assembly such that the memory cell is bonded to its respective selector element.

DETAILED DESCRIPTION

Figure 1A:
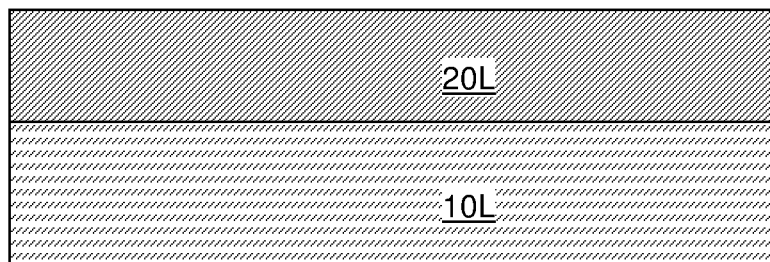
FIG. 1A is a vertical cross-sectional view of a first substrate after formation of a single crystalline semiconductor layer thereupon according to a first embodiment of the present disclosure.

Embodiments of the present disclosure provide bonded memory devices and methods of making thereof by bonding different portions of the same memory cell to each other. In the first and second embodiments, ferroelectric tunnel junction devices are formed by wafer bonding to obtain a high quality crystalline ferroelectric tunnel dielectric layer which is epitaxially grown on a template layer followed by bonding the ferroelectric tunnel dielectric layer to the selector element which is formed on a separate substrate. In the third and fourth embodiments, magnetoresistive random access memory (MRAM) and phase change memory (PCM) memory devices are bonded to one of word or bit lines and/or to a selector element formed on a separate substrate to avoid damaging the MRAM and PCM layers during reactive ion etching of the word or bit lines.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

Ferroelectric properties of a ferroelectric material depend on stabilizing a particular crystalline phase of the ferroelectric material. For example, hafnium oxide based layers exhibit ferroelectricity only in an orthorhombic phase (e.g., a non-centrosymmetric orthorhombic phase). The first and second embodiments of the present disclosure are directed to a memory device including crystalline ferroelectric memory elements and methods of making the same, the various aspects of which are described below. The crystalline layers of the memory device stabilize the ferroelectric crystallographic phase of the ferroelectric material to provide a high-performance ferroelectric device. In one embodiment, the crystalline ferroelectric material comprises a relatively thin, epitaxial hafnium oxide based layer in the orthorhombic phase. The hafnium oxide based layer is epitaxially grown on a germanium based buffer layer. After growth, the epitaxial hafnium oxide based layer is transferred to another substrate by wafer bonding and layer transfer methods.

Referring to FIG. 1A, a first exemplary structure according to a first embodiment of the present disclosure includes a first substrate 10L. The first substrate 10L which can be a single crystalline substrate on which a single crystalline semiconductor material can be subsequently grown. For example, the first substrate 10L may be a commercially available single crystalline silicon wafer. A single crystalline semiconductor layer 20L can be formed upon a top surface of the first substrate 10L by an epitaxial semiconductor deposition process. The single crystalline semiconductor layer 20L can include a germanium-containing single crystalline semiconductor material. For example, the single crystalline semiconductor layer 20L can include germanium or a silicon-germanium alloy. In one embodiment, the single crystalline semiconductor layer 20L may include germanium at an atomic percentage in a range from 50% to 100%. The single crystalline semiconductor layer 20L can be formed by performing an epitaxial semiconductor deposition process. In one embodiment, the bottom portion of the single crystalline semiconductor layer 20L may have a vertically graded material composition such that the atomic concentration of germanium increases with a distance from the top surface of the first substrate 10L. In one embodiment, the top portion of the single crystalline semiconductor layer 20L may include germanium at an atomic percentage in a range from 50% to 100%, such as from 80% to 90%. In one embodiment, the top portion of the single crystalline semiconductor layer 20L may include germanium at an atomic percentage of 100%. The thickness of the single crystalline semiconductor layer 20L may be in a range from 50 nm to 600 nm, such as from 100 nm to 300 nm, although lesser and greater thicknesses may also be employed.

Figure 1B:
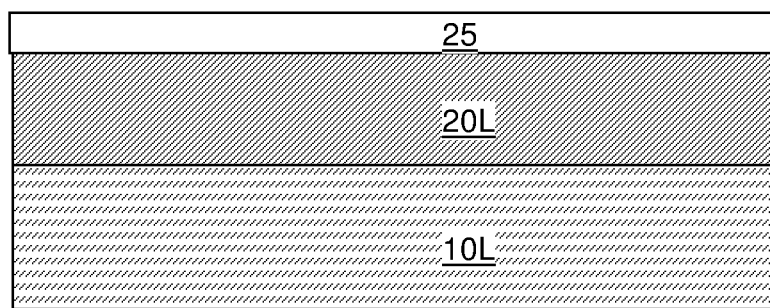
FIG. 1B is a vertical cross-sectional view of an assembly including the first substrate after formation of a semiconductor oxide layer thereupon according to the first embodiment of the present disclosure.

Referring FIG. 1B, an optional semiconductor oxide layer 25 can be formed on the top surface of the single crystalline semiconductor layer 20L. In one embodiment, the semiconductor oxide layer 25 may be formed by oxidation of a surface portion of the single crystalline semiconductor layer 20L. In one embodiment, the semiconductor oxide layer 25 may include germanium oxide, silicon oxide, or a silicon-germanium oxide. The thickness of the semiconductor oxide layer 25 can be in a range from 5 nm to 50 nm, such as from 10 nm to 30 nm, although lesser and greater thicknesses may also be employed.

Figure 1C:
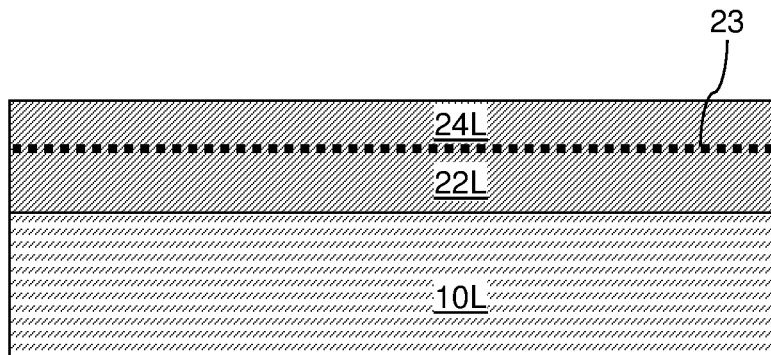
FIG. 1C is a vertical cross-sectional view of the assembly including the first substrate after formation of a hydrogen implanted layer and removal of the semiconductor oxide layer according to the first embodiment of the present disclosure.

Referring to FIG. 1C, hydrogen or deuterium atoms can be implanted through the semiconductor oxide layer 25 into the single crystalline semiconductor layer 20L to form an implanted layer (i.e., hydrogen or deuterium implanted region) 23. The single crystalline semiconductor layer 20L is divided into a proximal single crystalline semiconductor layer 22L and a distal single crystalline semiconductor layer 24L. The thickness of the proximal single crystalline semiconductor layer 22L may be in a range from 25 nm to 300 nm, such as from 50 nm to 150 nm, although lesser and greater thicknesses may also be employed. The thickness of the distal single crystalline semiconductor layer 24L may be in a range from 25 nm to 300 nm, such as from 50 nm to 150 nm, although lesser and greater thicknesses may also be employed. In one embodiment, the distal single crystalline semiconductor layer 24L may comprise, and/or may consist essentially of, germanium or a silicon-germanium alloy including germanium at an atomic percentage in a range from 50% to 100%. The semiconductor oxide layer 25 can be removed, for example, by a selective wet etch process. A suitable surface clean process may be performed on a physically exposed top surface of the distal single crystalline semiconductor layer 24L.

Figure 1D:
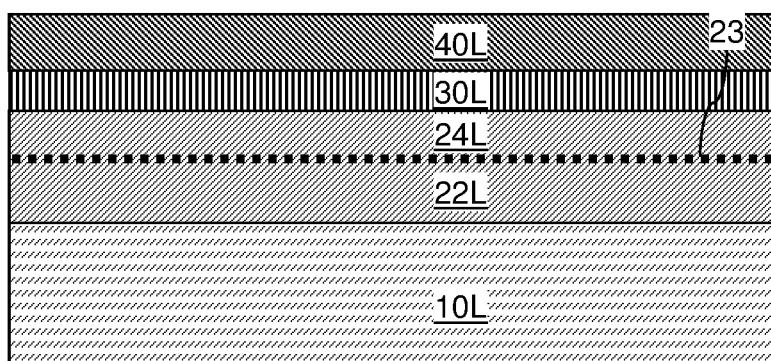
FIG. 1D is a vertical cross-sectional view of the assembly including the first substrate after formation of a single crystalline ferroelectric material layer and a first metallic material layer according to the first embodiment of the present disclosure.

Referring to FIG. 1D, a memory material layer, such as a single crystalline ferroelectric material layer 30L can be epitaxially grown on the top surface of the distal single crystalline semiconductor layer 24L. The single crystalline ferroelectric material layer 30L includes a single crystalline ferroelectric material that is epitaxially aligned to the single crystalline semiconductor material of the distal single crystalline semiconductor layer 24L.

In one embodiment, the single crystalline ferroelectric material layer 30L can include a transition metal oxide material. In one embodiment, the transition metal oxide material comprises a hafnium oxide based material, which comprises doped or undoped hafnium oxide. In an illustrative example, the single crystalline ferroelectric material layer 30L may include single crystalline hafnium oxide doped with zirconium (also referred to as hafnium-zirconium oxide), silicon, strontium, aluminum, yttrium, germanium and/or gadolinium.

In another embodiment, the transition metal oxide material comprises a perovskite material, such as barium titanate (such as $BaTiO_3$: BT), europium barium titanate, lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), potassium niobate (such as $KNbO_3$), sodium bismuth titanate (such as $Na_{0.5}Bi_{0.5}TiO_3$), lithium tantalate (such as $LiTaO_3$ (LT)), lead lanthanum titanate (such as $(Pb,La)TiO_3$ (PLT)), or lead lanthanum zirconate titanate (such as $(Pb,La)(Zr,Ti)O_3$ (PLZT)). In case of perovskite materials, layers of strontium titanate ($SrTiO_3$) or strontium ruthenate ($SrRuO_3$) may be used as the distal crystalline layer 24L.

The single crystalline ferroelectric material layer 30L may be epitaxially grown by atomic layer deposition or another suitable method. The dopants may be introduced in-situ or ex-situ (for example, by ion implantation). The thickness of the single crystalline ferroelectric material layer 30L may be in a range from 2 nm to 30 nm, such as from 5 nm to 15 nm, for example about 10 nm, although lesser and greater thicknesses may also be employed. A thermal anneal can be performed to improve crystallinity of the material of the single crystalline ferroelectric material layer 30L and to enhance ferroelectric properties (such as magnitude of electrical polarization) of the ferroelectric material of the single crystalline ferroelectric material layer 30L. For example, layer 30L may be a hafnium oxide based ferroelectric layer having the ferroelectric non-centrosymmetric orthorhombic phase after the anneal.

A first metallic material layer 40L can be formed by deposition of a first metallic material on the top surface of the single crystalline ferroelectric material layer 30L. The first metallic material layer 40L may include an elemental metal, such as W, Mo or Ru, and/or a conductive metallic compound material, such as MoN, TiN, TaN, or WN. The first metallic material layer 40L can be formed by chemical vapor deposition or by physical vapor deposition. The first metallic material layer 40L can have a thickness in a range from 5 nm to 50 nm, such as from 10 nm to 25 nm, although lesser and greater thicknesses may also be employed.

Figure 2A:
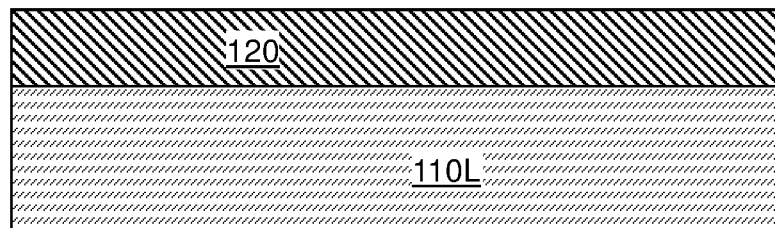
FIG. 2A is a vertical cross-sectional view along plane A-A' in FIG. 2B of a second substrate after formation of first electrically conductive lines laterally spaced by first dielectric rails thereupon according to the first embodiment of the present disclosure.
Figure 2B:
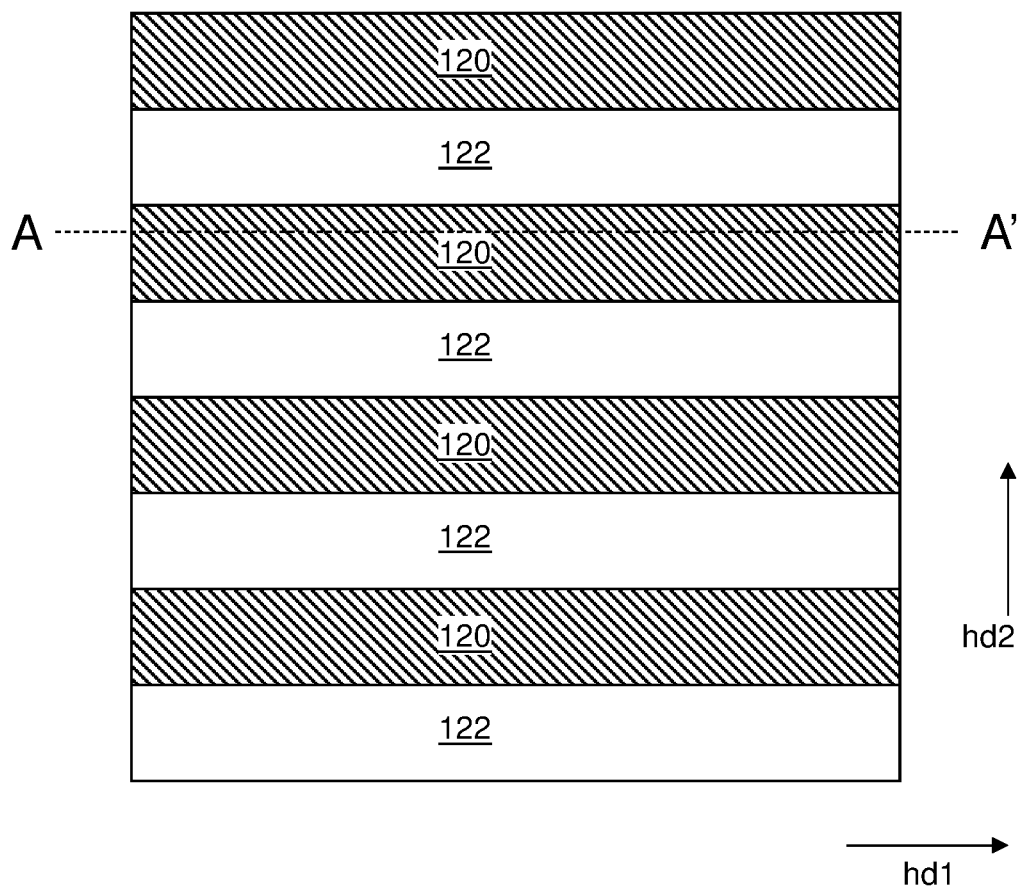
FIG. 2B is a top-down view of the structure of FIG. 2A.

Referring to FIG. 2A, a second substrate 110L can be provided. The second substrate 110L may include an insulating material layer at a topmost portion thereof. In one embodiment, the second substrate 110L may include a semiconductor substrate such as a silicon wafer, and semiconductor devices (not expressly shown) such as field effect transistors that are formed on the semiconductor substrate. Dielectric material layers (not expressly shown) embedding metal interconnect structures (not expressly shown) can be formed over the semiconductor devices. The metal interconnect structures can provide electrical interconnection among the various nodes of the semiconductor devices.

A dielectric material layer can be deposited over the second substrate 110L. The dielectric material layer includes a dielectric material such as silicon oxide, and can be formed by chemical vapor deposition. The thickness of the dielectric material layer may be in a range from 50 nm to 500 nm, although lesser and greater thicknesses can also be employed. A photoresist layer (not shown) can be applied over the dielectric material layer, and can be lithographically patterned to form a line and space pattern. Elongated openings laterally extending along a first horizontal direction hd1 and laterally spaced apart among one another along a second horizontal direction hd2 can be formed in the photoresist layer. The width of each opening along the second horizontal direction hd2 can be in a range from 10 nm to 50 nm, such as 15 nm to 25 nm, although lesser and greater widths can also be employed. The pitch of the line and space pattern may be in a range from 20 nm to 100 nm, such as from 30 nm to 50 nm, although lesser and greater pitches may also be employed. The pattern in the photoresist layer can be transferred through the dielectric material layer by an anisotropic etch process. The photoresist layer can be employed as an etch mask during the anisotropic etch process. First line trenches can be formed through the dielectric material layer. The photoresist layer can be subsequently removed, for example, by ashing. Remaining portions of the dielectric material layer comprise first dielectric rails 122.

An optional metallic liner layer including a metallic barrier material can be deposited in the first line trenches and over the first dielectric rails 122. The metallic liner layer can include a conductive metallic barrier material such as a conductive metallic nitride material (e.g., TiN, TaN, and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface of the first dielectric rails. Each remaining portion of the metallic fill material layer comprises a first metallic fill material portion. Each remaining portion of the metallic liner layer comprises a first metallic liner. Each contiguous combination of a first metallic liner and a first metallic fill material portion constitutes a first electrically conductive line 120. The first electrically conductive lines 120 laterally extend along the first horizontal direction hd1, and are laterally spaced apart along the second horizontal direction hd2. Generally, first electrically conductive lines 120 laterally spaced by first dielectric rails 122 are formed over the second substrate 110L.

Alternatively, the first electrically conductive lines 120 may be formed first by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 3:
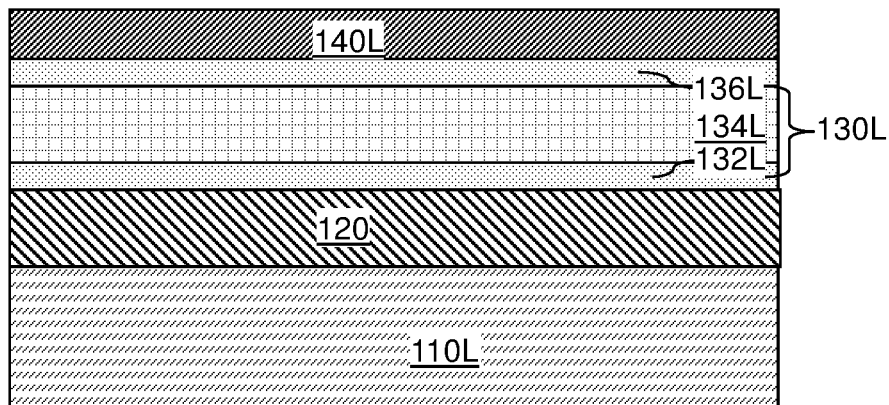
FIG. 3 is a vertical cross-sectional view of an assembly including the second substrate after formation of a lower electrode layer, a selector material layer, an upper electrode layer, and a second metallic material layer thereupon according to the first embodiment of the present disclosure.

Referring to FIG. 3, a layer stack comprising a selector material layer 134L and a second metallic material layer 140L can be formed over the first electrically conductive lines 120. In one embodiment, the layer stack can include, from bottom to top, a lower electrode layer 132L, the selector material layer 134L, an upper electrode layer 136L, and the second metallic material layer 140L. The combination of the lower electrode layer 132L, the selector material layer 134L, and the upper electrode layer 136L is herein referred to as selector-level layers 130L.

Each of the lower electrode layer 132L and the upper electrode layer 136L includes at least one electrically conductive material. The at least one electrically conductive material may include a non-metallic conductive material. Exemplary non-metallic conductive materials that can be employed for the lower electrode layer 132L and the upper electrode layer 136L include amorphous carbon, amorphous boron-doped carbon, amorphous nitrogen-doped carbon, amorphous silicon, amorphous germanium, alloys or mixtures thereof, and layer stacks thereof. Each of the lower electrode layer 132L and the upper electrode layer 136L may be free of transition metal elements. Each of the lower electrode layer 132L and the upper electrode layer 136L may be deposited by chemical vapor deposition, physical vapor deposition, or atomic layer deposition. Each of the lower electrode layer 132L and the upper electrode layer 136L can have a respective thickness in a range from 0.5 nm to 10 nm, such as from 1 nm to 5 nm, although lesser and greater thicknesses may also be employed.

The selector material layer 134L includes a material that can function as a voltage-dependent switch. Generally, the selector material layer 134L can include any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). In one embodiment, the selector material layer 134L includes an ovonic threshold switch material.

As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a selector material layer 134L which contains any ovonic threshold switch material. In one embodiment, the selector material layer 134L can include, and/or can consist essentially of, a GeSeAs alloy, a GeSe alloy, a SeAs alloy, a GeTe alloy, or a SiTe alloy.

In one embodiment, the material of the selector material layer 134L can be selected such that the resistivity of the selector material layer 134L decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 134L can be selected such that the critical bias voltage magnitude can be in a range from 1 V to 4 V, although lesser and greater voltages can also be employed for the critical bias voltage magnitude. The thickness of the selector material layer 134L can be, for example, in a range from 5 nm to 40 nm, such as 10 nm to 20 nm, although lesser and greater thicknesses can also be employed.

The second metallic material layer 140L can be formed by deposition of a second metallic material on the top surface of the selector-level layers 130L. The second metallic material layer 140L may include an elemental metal (such as W or Ru) and/or a conductive metallic compound material such as (TiN, TaN, or WN). The second metallic material layer 140L can be formed by chemical vapor deposition or by physical vapor deposition. The second metallic material layer 140L can have a thickness in a range from 5 nm to 50 nm, such as from 10 nm to 25 nm, although lesser and greater thicknesses may also be employed. Generally, the materials of the first metallic material layer 40L and the second metallic material layer 140L can be selected such that the first metallic material layer 40L and the second metallic material layer 140L can be subsequently bonded to each other. The material of the second metallic material layer 140L may be the same as, or may be different from, the material of the first metallic material layer 40L.

Figure 4:
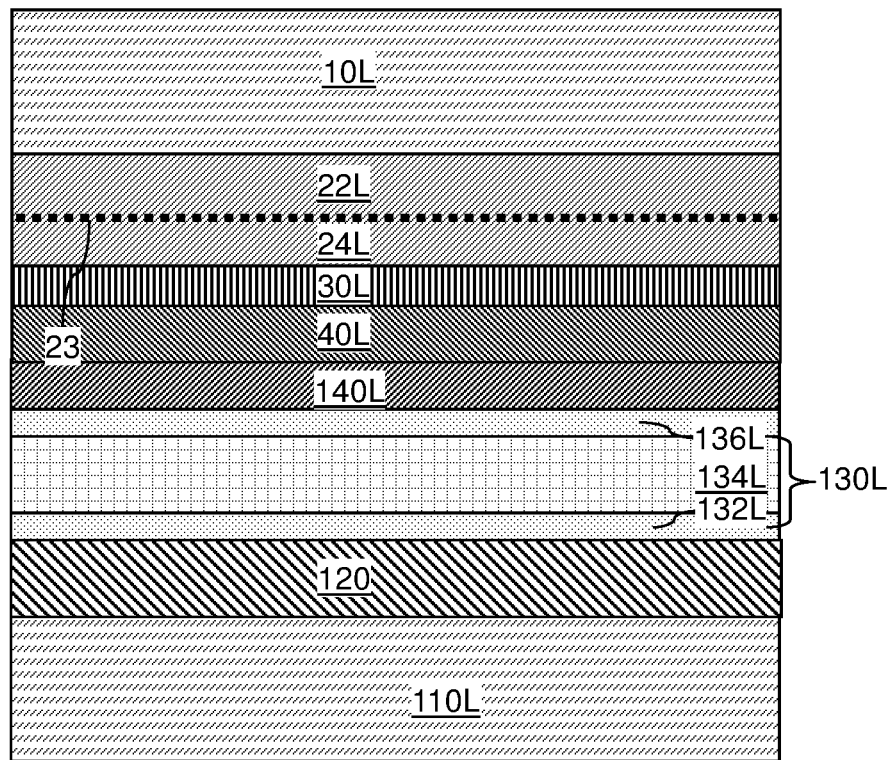
FIG. 4 is a vertical cross-sectional view of a first exemplary structure after bonding the second metallic material layer to the first metallic material layer according to the first embodiment of the present disclosure.

Referring to FIG. 4, the structure of FIG. 3 and the structure of FIG. 1D can be positioned such that the second metallic material layer 140L contacts the first metallic material layer 40L. A first thermal anneal process is performed to bond the second metallic material layer 140L to the first metallic material layer 40L. The temperature of the first thermal anneal process can be in a range from 200 degrees Celsius to 500 degrees Celsius, such as from 250 degrees Celsius to 400 degrees Celsius. The temperature of the first thermal anneal process may be limited by the thermal stability of the ferroelectric material of the single crystalline ferroelectric material layer 30L and the thermal stability of the implanted layer 23. Alternatively, the second metallic material layer 140L may be omitted, and metal-hybrid bonding can be used instead.

Figure 5:
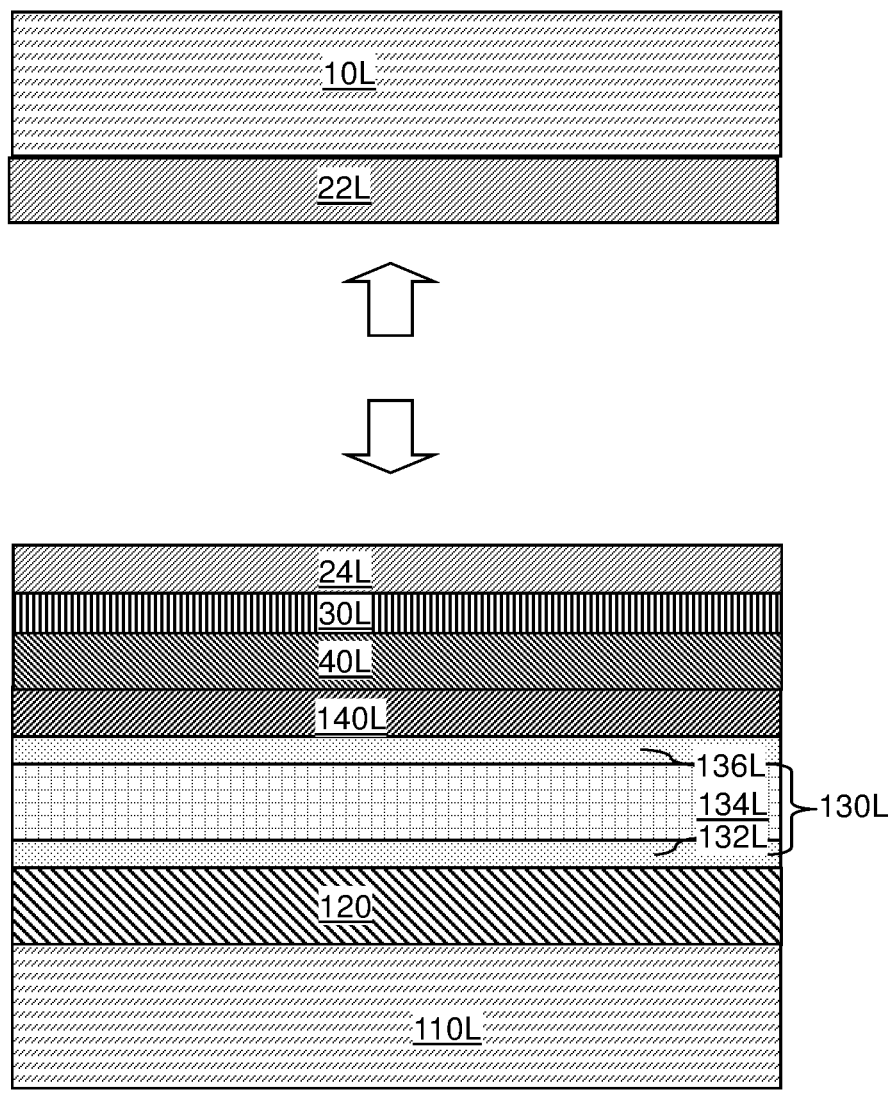
FIG. 5 is a vertical cross-sectional view of the first exemplary structure after removing an assembly of the first substrate and a proximal single crystalline semiconductor sublayer by cleaving the single crystalline semiconductor layer at the hydrogen implanted layer according to the first embodiment of the present disclosure.

Referring to FIG. 5, the single crystalline semiconductor layer 20L (i.e., 22L, 24L) can be cleaved (i.e., separated) at the hydrogen or deuterium implanted layer 23. A second thermal anneal process can be performed to induce bubbling of hydrogen or deuterium atoms in the hydrogen implanted layer 23. For example, the temperature of the second thermal anneal process may be in a range from 500 degrees Celsius to 700 degrees Celsius. The assembly of the first substrate 10L and the proximal single crystalline semiconductor layer 22L can be detached from the assembly including the second substrate 110L, the first electrically conductive lines 120 and the first dielectric rails 122, the selector-level layers 130L, the second metallic material layer 140L, the first metallic material layer 40L, the single crystalline ferroelectric material layer 30L, and the distal single crystalline semiconductor layer 24L (which is hereafter referred to as a single crystalline semiconductor layer 24L).

Figure 6:
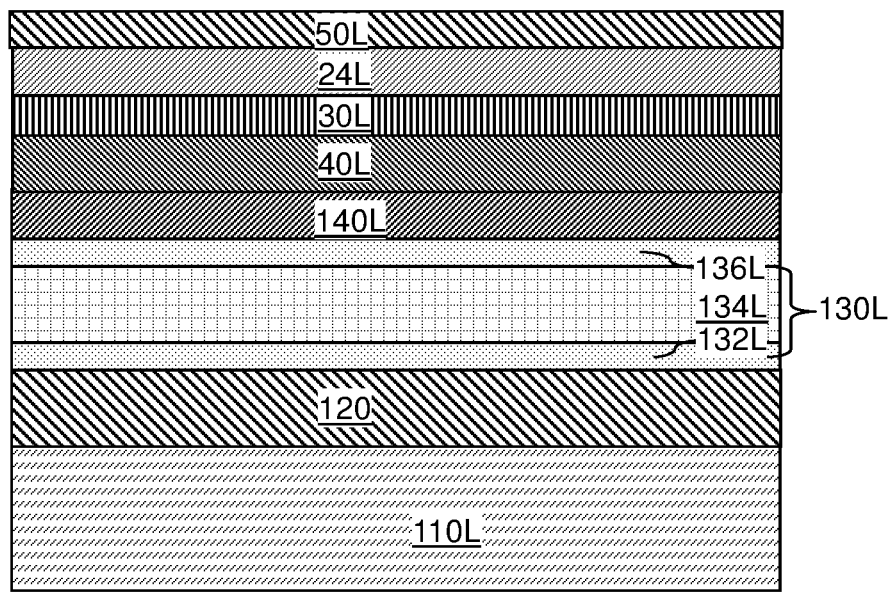
FIG. 6 is a vertical cross-sectional view of the first exemplary structure after formation of a metallic cap layer according to the first embodiment of the present disclosure.
Figure 10A:
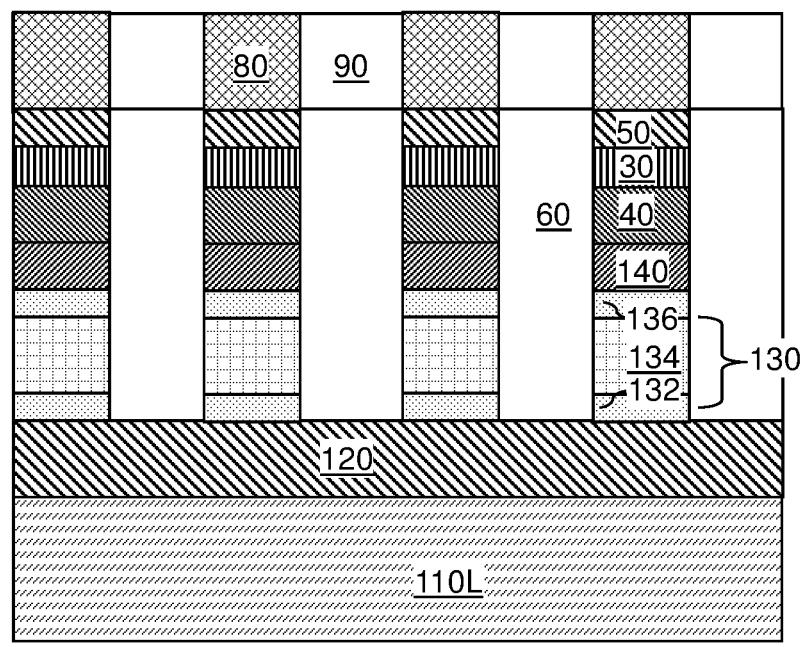
FIG. 10A is a vertical cross-sectional view along plane A-A' in FIG. 10B of an alternative configuration of the first exemplary structure after formation of second electrically conductive lines laterally spaced by second dielectric rails according to the first embodiment of the present disclosure.
Figure 10B:
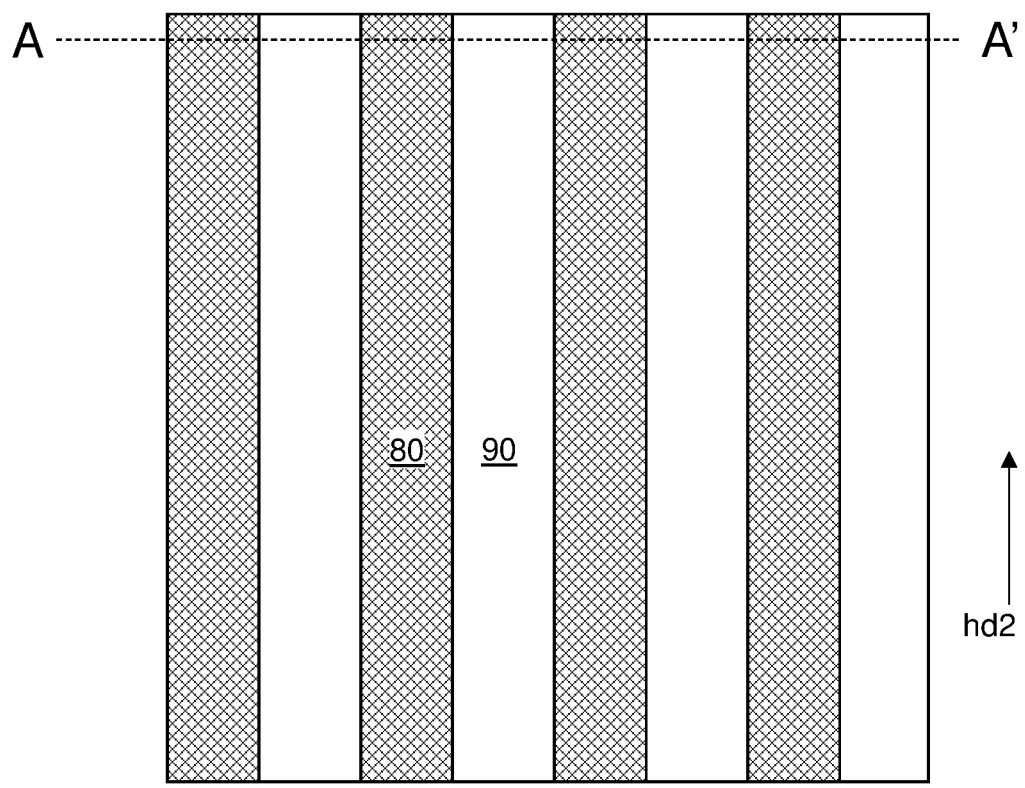
FIG. 10B is a top-down view of the first exemplary structure of FIG. 10A.

If desired, the single crystalline semiconductor layer 24L may be removed by selective etching to expose the single crystalline ferroelectric material layer 30L. Alternatively, the single crystalline semiconductor layer 24L may be retained either partially or completely as part of an electrode of a ferroelectric tunnel junction memory device. Referring to FIG. 6, a metallic cap layer 50L can be optionally deposited on the top surface of the single crystalline semiconductor layer 24L (if layer 24L is retained). If layer 24L is removed, then the metallic cap layer 50L can be optionally deposited on the top surface of the single crystalline ferroelectric material layer 30L, such that the device shown in FIGS. 10A and 10B is formed after the steps shown in FIGS. 7 to 8B and described below.

The metallic cap layer 50L comprises, and/or consists essentially of, a material selected from an elemental metal, an intermetallic alloy, a conductive metallic nitride material, a conductive metallic carbide material, and a conductive carbon-based material. Exemplary elemental metals that can be employed for the metallic cap layer 50L include transition metals. Exemplary conductive metallic nitride materials include TiN, TaN, MoN and WN. Exemplary conductive metallic carbide materials include TiC, TaC, and WC. Conductive carbon-based materials include amorphous carbon or diamond-like carbon doped with suitable dopant atoms such as nitrogen to increase the electrical conductivity. For example, the metallic cap layer 50L can consist essentially of W, TiN, TaN, MoN or WN. The metallic cap layer 50L can be formed by physical vapor deposition or chemical vapor deposition. The thickness of the metallic cap layer 50L can be in a range from 10 nm to 80 nm, such as from 20 nm to 50 nm, and/or from 30 nm to 40 nm, although lesser and greater thicknesses can also be employed.

Figure 7:
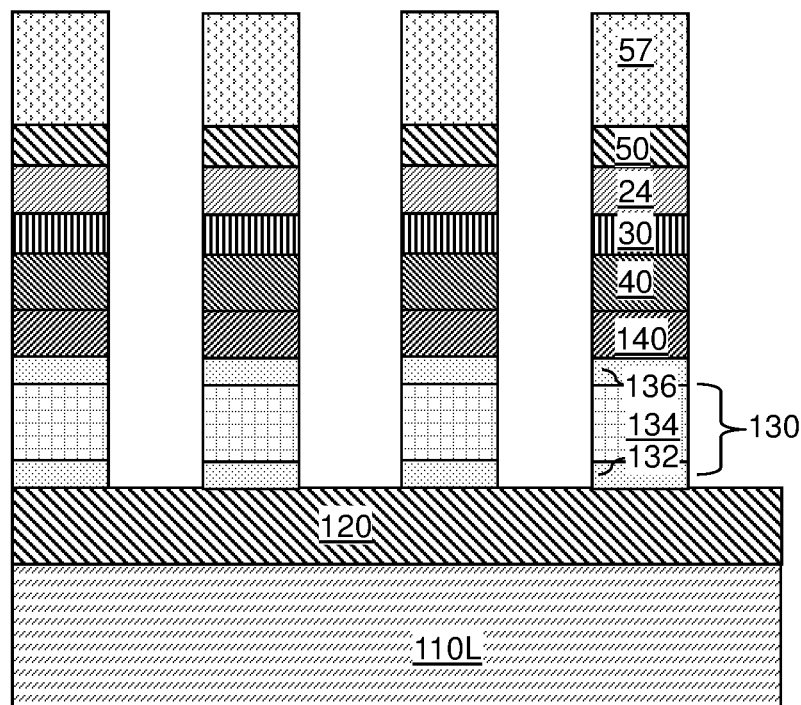
FIG. 7 is a vertical cross-sectional view of the first exemplary structure after formation of an array of memory pillar structures according to the first embodiment of the present disclosure.

Referring to FIG. 7, a photoresist and hard mask layer can be applied over the metallic cap layer 50L, and can be lithographically patterned to form a two-dimensional array of discrete photoresist material portions 57. In one embodiment, the two-dimensional array of discrete photoresist and hard mask material portions 57 can be formed as a two-dimensional periodic rectangular array. In one embodiment, the two-dimensional array of discrete photoresist and hard mask material portions 57 may have a pitch along the second horizontal direction hd2 that is the same as the pitch of the first electrically conductive lines 120 along the second horizontal direction, and may have a pitch along the first horizontal direction hd1 that is the same as the pitch along the first horizontal direction hd1 of second electrically conductive lines to be subsequently formed.

An anisotropic etch process can be performed to transfer the pattern in the two-dimensional array of discrete photoresist material portions 57 through the layer stack including the metallic cap layer 50L, the distal single crystalline semiconductor layer 24L (if present), the single crystalline ferroelectric material layer 30L, the first metallic material layer 40L, the second metallic material layer 140L, and the selector-level layers 130L. Each patterned portion of the layer stack of the metallic cap layer 50L, the distal single crystalline semiconductor layer 24L, the single crystalline ferroelectric material layer 30L, the first metallic material layer 40L, the second metallic material layer 140L, and the selector-level layers 130L comprises a memory pillar structure (130, 140, 40, 30, 24, 50). Generally, at least one memory pillar structure (130, 140, 40, 30, 24, 50) can be formed by patterning the layer stack comprising the metallic cap layer 50L, the distal single crystalline semiconductor layer 24L, the single crystalline ferroelectric material layer 30L, the first metallic material layer 40L, the second metallic material layer 140L, and the selector-level layers 130L. In one embodiment, a two-dimensional periodic rectangular array of memory pillar structures (130, 140, 40, 30, 24, 50) can be formed.

Each memory pillar structure (130, 140, 40, 30, 24, 50) can include, from bottom to top, a selector element 130, a second metallic material plate 140, a first metallic material plate 40, a single crystalline ferroelectric material plate 30, an optional single crystalline semiconductor plate 24, and a metallic cap plate 50. Each selector element 130 is a patterned portion of the selector-level layers 130L. Each selector element 130 may include, from bottom to top, a lower electrode plate 132, a selector material plate 134, and an upper electrode plate 136. Each second metallic material plate 140 is a patterned portion of the second metallic material layer 140L. Each first metallic material plate 40 is a patterned portion of the first metallic material layer 40L. Each single crystalline ferroelectric material plate 30 is a patterned portion of the single crystalline ferroelectric material layer 30L. Each single crystalline semiconductor plate 24 (if present) is a patterned portion of the single crystalline semiconductor layer 24L. Each metallic cap plate 50 is a patterned portion of the metallic cap layer 50L.

Each memory pillar structure (130, 140, 40, 30, 24, 50) can have at least one sidewall that extends from the top surface of the respective memory pillar structure (130, 140, 40, 30, 24, 50) to the bottom surface of the memory pillar structure (130, 140, 40, 30, 24, 50). Each sidewall may be vertical, substantially vertical, or may have a taper angle in a range from 1 degree to 15 degrees. The discrete photoresist and hard mask material portions 57 can be subsequently removed, for example, by ashing. The memory pillar structures (130, 140, 40, 30, 24, 50) can have horizontal cross-sectional shapes of a rectangle, a rounded rectangle, a circle, an ellipse, or any generally curvilinear two-dimensional closed shape.

Figure 8A:
FIG. 8A is a vertical cross-sectional view along plane A-A' in FIG. 8B of the first exemplary structure after formation of a dielectric isolation structure according to the first embodiment of the present disclosure.
Figure 8B:
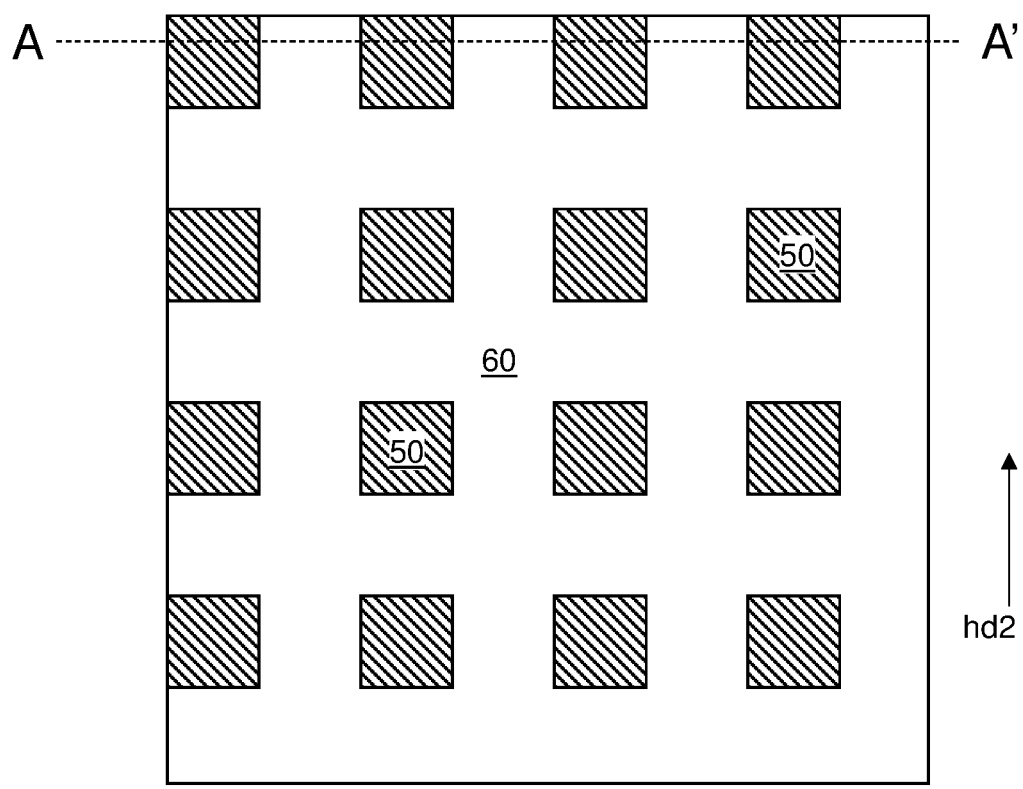
FIG. 8B is a top-down view of the first exemplary structure of FIG. 8A.

Referring to FIGS. 8A and 8B, an optional dielectric diffusion barrier liner (not shown) may be optionally formed on the physically exposed surfaces of the memory pillar structures (130, 140, 40, 30, 24, 50). A dielectric fill material such as undoped silicate glass, a doped silicate glass, or organosilicate glass. Portions of the dielectric fill material and the dielectric diffusion barrier liner that overlie the horizontal plane including the top surfaces of the memory pillar structures (130, 140, 40, 30, 24, 50) by a planarization process such as a chemical mechanical planarization process. The top surfaces of the metallic cap plates 50 can be employed as stopping surfaces for the planarization process. The remaining portions of the dielectric fill material and the dielectric diffusion barrier liner comprise a dielectric isolation structure 60. The dielectric isolation structure 60 can laterally surround the two-dimensional array of memory pillar structures (130, 140, 40, 30, 24, 50).

Figure 9A:
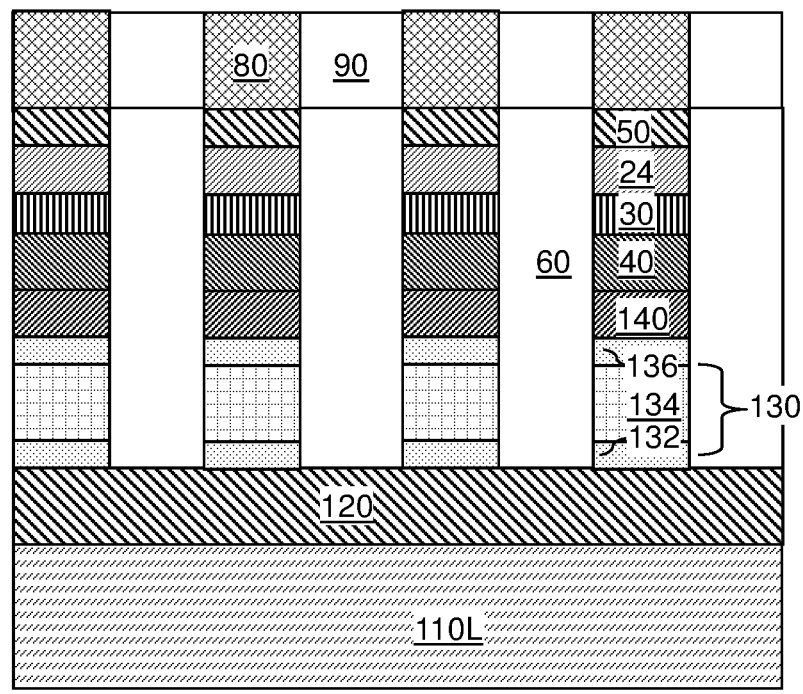
FIG. 9A is a vertical cross-sectional view along plane A-A' in FIG. 9B of the first exemplary structure after formation of second electrically conductive lines laterally spaced by second dielectric rails according to the first embodiment of the present disclosure.
Figure 9B:
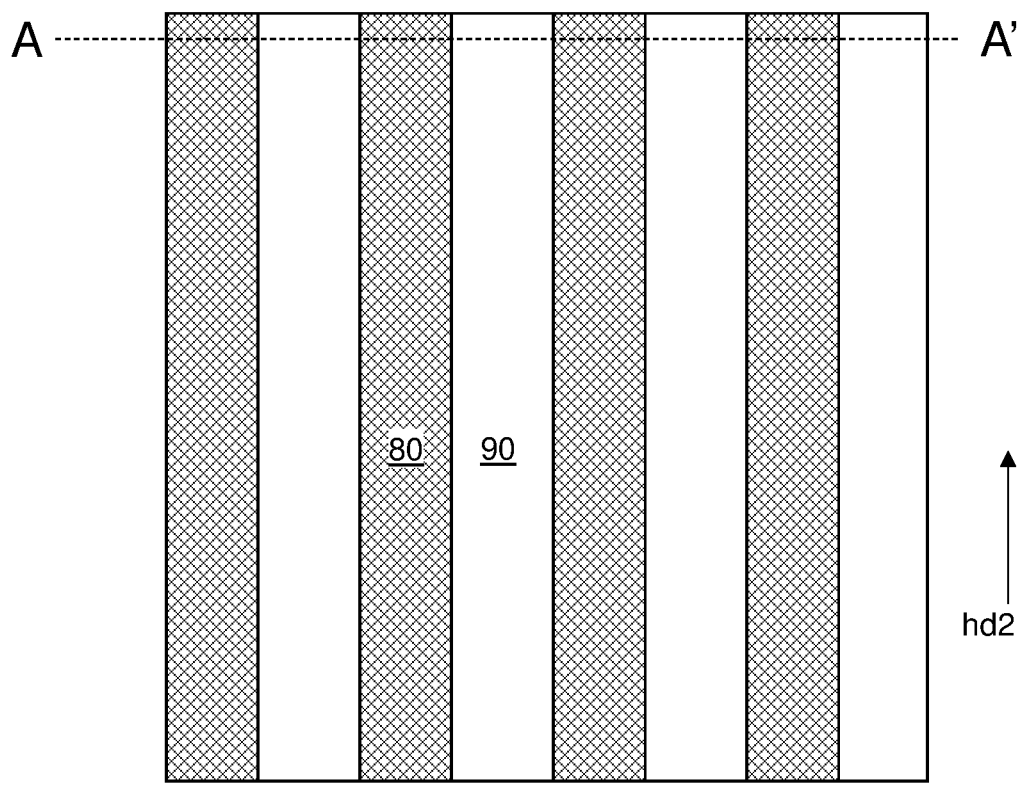
FIG. 9B is a top-down view of the first exemplary structure of FIG. 9A.

Referring to FIGS. 9A and 9B, a dielectric material layer can be deposited over the two-dimensional array of memory pillar structures (130, 140, 40, 30, 24, 50). The dielectric material layer includes a dielectric material such as silicon oxide, and can be formed by chemical vapor deposition. The thickness of the dielectric material layer may be in a range from 50 nm to 500 nm, although lesser and greater thicknesses can also be employed. A photoresist layer (not shown) can be applied over the dielectric material layer, and can be lithographically patterned to form a line and space pattern. Elongated openings laterally extending along the second horizontal direction hd2 and laterally spaced apart among one another along the first horizontal direction hd1 can be formed in the photoresist layer. The width of each opening along the first horizontal direction hd1 can be in a range from 10 nm to 50 nm, such as 15 nm to 25 nm, although lesser and greater widths can also be employed. The pitch of the line and space pattern may be in a range from 20 nm to 100 nm, such as from 30 nm to 50 nm, although lesser and greater pitches may also be employed. The pitch of the line and space pattern can be the same as the pitch of the two-dimensional array of memory pillar structures (130, 140, 40, 30, 24, 50) along the first horizontal direction hd1. The pattern in the photoresist layer can be transferred through the dielectric material layer by an anisotropic etch process. The photoresist layer can be employed as an etch mask during the anisotropic etch process. Optionally an additional hard mask layer (not shown) may be used in conjunction with the photoresist layer to define the line and space pattern. Second line trenches can be formed through the dielectric material layer. The photoresist layer and hard mask layer can be subsequently removed, for example, by ashing. Remaining portions of the dielectric material layer comprise second dielectric rails 90.

A metallic liner layer including a metallic barrier material can be deposited in the second line trenches and over the second dielectric rails 90. The metallic liner layer can include a conductive metallic barrier material such as a conductive metallic nitride material (e.g., TiN, TaN, MoN and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface of the second dielectric rails 90. Each remaining portion of the metallic fill material layer comprises a second metallic fill material portion. Each remaining portion of the metallic liner layer comprises a second metallic liner. Each contiguous combination of a second metallic liner and a second metallic fill material portion constitutes a second electrically conductive line 80. The second electrically conductive lines 80 laterally extend along the second horizontal direction hd2, and are laterally spaced apart along the first horizontal direction hd1.

Alternatively, the second electrically conductive lines 80 may be formed first by depositing one or more electrically conductive layers, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Referring to FIGS. 10A and 10B, an alternative configuration of the first exemplary structure can be derived from the first exemplary structure of FIGS. 9A and 9B by removing the distal single crystalline semiconductor layer 24L after the processing steps of FIG. 5 prior to deposition of the metallic cap layer 50L at the processing steps of FIG. 6. In this case, the metallic cap layer 50L can be formed directly on the top surface of the single crystalline ferroelectric material layer 30L. Thus, each memory pillar structure (130, 140, 40, 30, 24, 50) can include, and may consist of, a selector element 130, a second metallic material plate 140, a first metallic material plate 40, a single crystalline ferroelectric material plate 30, and a metallic cap plate 50.

Figure 11A:
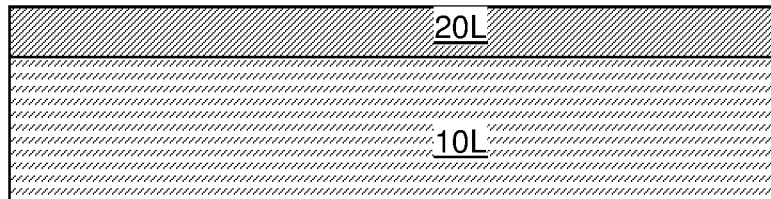
FIG. 11A is a vertical cross-sectional view of a first substrate after formation of a single crystalline semiconductor layer thereupon according to a second embodiment of the present disclosure.

In a second embodiment of the present disclosure, chemical or mechanical substrate removal is used instead of cleaving along the implanted layer 23. Referring to FIG. 11A, an exemplary structure according to a second embodiment of the present disclosure includes a first substrate 10L, which may be the same as the first substrate 10L of FIG. 1A. A single crystalline semiconductor layer 20L can be formed on a top surface of the first substrate 10L by an epitaxial semiconductor deposition process. The single crystalline semiconductor layer 20L can include a germanium-containing single crystalline semiconductor material. For example, the single crystalline semiconductor layer 20L can include germanium or a silicon-germanium alloy. In one embodiment, the single crystalline semiconductor layer 20L may include germanium at an atomic percentage in a range from 50% to 100%. The single crystalline semiconductor layer 20L can be formed by performing an epitaxial semiconductor deposition process. In one embodiment, the bottom portion of the single crystalline semiconductor layer 20L may have a vertically graded material composition such that the atomic concentration of germanium increases with a distance from the top surface of the first substrate 10L. In one embodiment, the top portion of the single crystalline semiconductor layer 20L may include germanium at an atomic percentage in a range from 50% to 100%, such as from 80% to 90%. In one embodiment, the top portion of the single crystalline semiconductor layer 20L may include germanium at an atomic percentage of 100%. The thickness of the single crystalline semiconductor layer 20L may be in a range from 25 nm to 300 nm, such as from 50 nm to 150 nm, although lesser and greater thicknesses may also be employed.

Figure 11B:
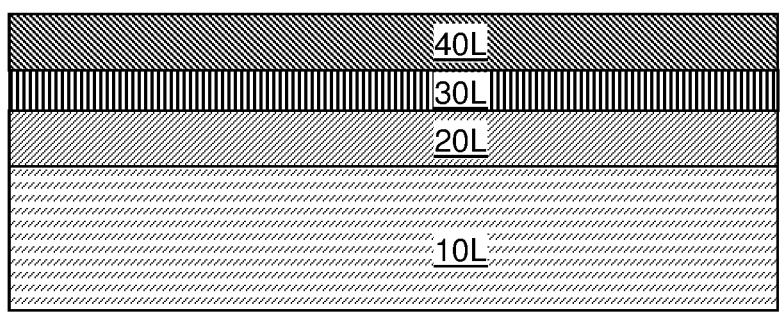
FIG. 11B is a vertical cross-sectional view of an assembly including the first substrate after formation of a single crystalline ferroelectric material layer and a first metallic material layer according to the second embodiment of the present disclosure.

Referring to FIG. 11B, a single crystalline ferroelectric material layer 30L can be epitaxially grown on the top surface of the single crystalline semiconductor layer 20L. The single crystalline ferroelectric material layer 30L includes a single crystalline ferroelectric material that is epitaxially aligned to the single crystalline semiconductor material of the single crystalline semiconductor layer 20L. In one embodiment, the single crystalline ferroelectric material layer 30L can include a transition metal oxide material, as described with respect to the first embodiment. A thermal anneal can be performed to improve crystallinity of the material of the single crystalline ferroelectric material layer 30L and to enhance ferroelectric properties (such as magnitude of electrical polarization) of the ferroelectric material of the single crystalline ferroelectric material layer 30L.

A first metallic material layer 40L can be formed by deposition of a first metallic material on the top surface of the single crystalline ferroelectric material layer 30L. The first metallic material layer 40L may include an elemental metal (such as W, Mo or Ru) and/or a conductive metallic compound material such as (TiN, TaN, or WN). The first metallic material layer 40L can be formed by chemical vapor deposition or by physical vapor deposition. The first metallic material layer 40L can have a thickness in a range from 5 nm to 50 nm, such as from 10 nm to 25 nm, although lesser and greater thicknesses may also be employed.

Figure 12:
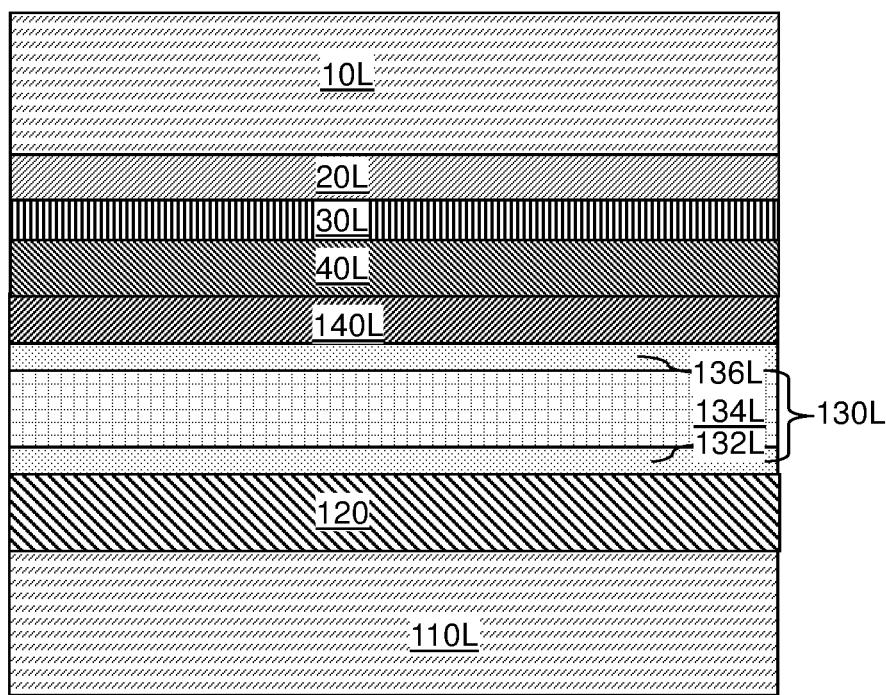
FIG. 12 is a vertical cross-sectional view of a second exemplary structure after attaching an assembly of a second substrate, first electrically conductive lines laterally spaced by first dielectric rails, a lower electrode layer, a selector material layer, an upper electrode layer, and a second metallic material layer according to the second embodiment of the present disclosure.

Referring to FIG. 12, the structure of FIG. 3 is provided, and the second metallic material layer 140L is bonded to the first metallic material layer 40L by performing a thermal anneal process.

Figure 13:
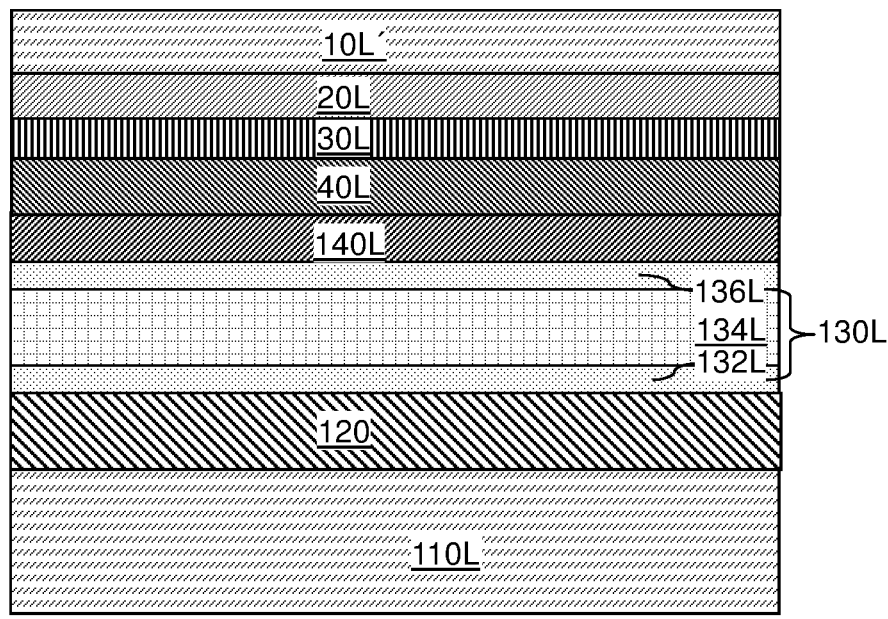
FIG. 13 is a vertical cross-sectional view of the second exemplary structure after thinning the first substrate according to the second embodiment of the present disclosure.

Referring to FIG. 13, the first substrate 10L can be thinned from the backside by performing a thinning process. The thinning process may comprise a grinding process, a wet etch process, a dry etch process, and/or a polishing process. The thickness of the first substrate 10L after thinning may be in a range from 100 nm to 5,000 nm.

Figure 14:
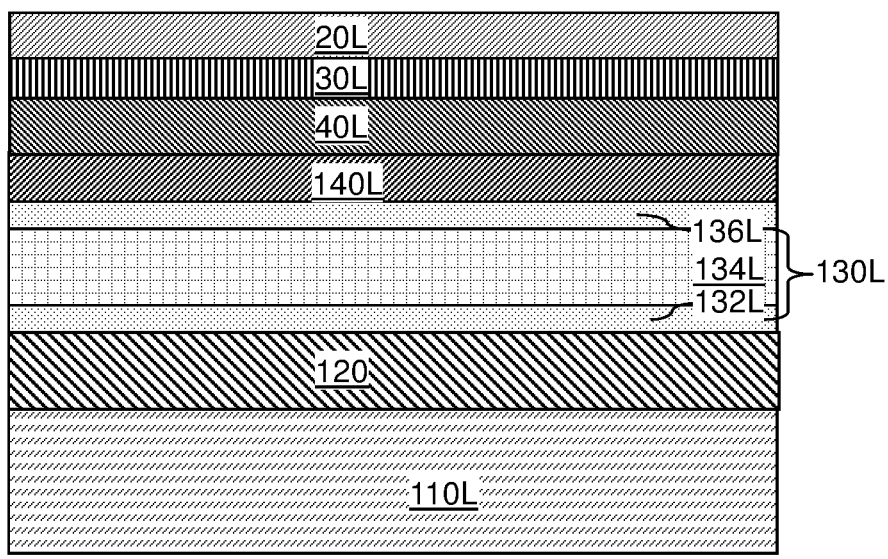
FIG. 14 is a vertical cross-sectional view of the second exemplary structure after removal of the thinned first substrate according to the second embodiment of the present disclosure.

Referring to FIG. 14, the remaining portion of the first substrate 10L may be removed selective to the single crystalline semiconductor layer 20L by an additional thinning process, which may include a chemical mechanical polishing process. The top surface of the single crystalline semiconductor layer 20L can be physically exposed.

Figure 15:
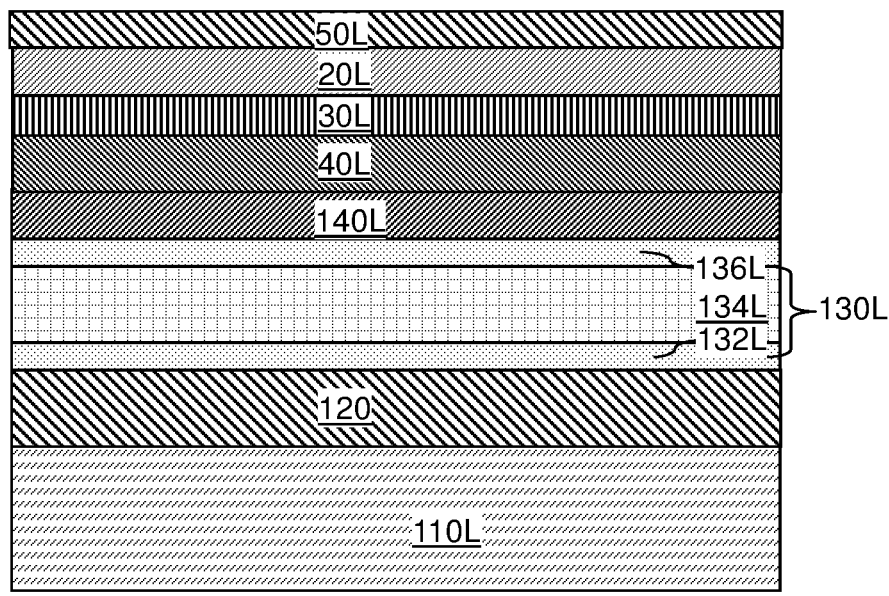
FIG. 15 is a vertical cross-sectional view of the second exemplary structure after formation of a metallic cap layer according to the second embodiment of the present disclosure.

Referring to FIG. 15, the processing steps of FIG. 6 can be performed to form a metallic cap layer 50L.

Figure 16:
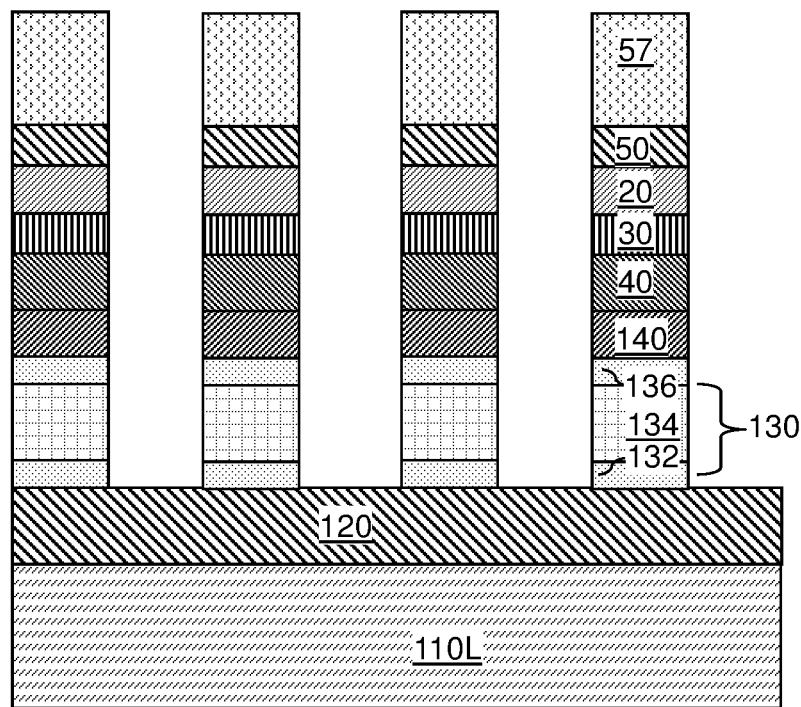
FIG. 16 is a vertical cross-sectional view of the second exemplary structure after formation of an array of memory pillar structures according to the second embodiment of the present disclosure.

Referring to FIG. 16, the processing steps of FIG. 7 can be performed to form a two-dimensional array of memory pillar structures (130, 140, 40, 30, 24, 50).

Figure 17A:
FIG. 17A is a vertical cross-sectional view of the second exemplary structure after formation of a dielectric isolation structure according to the second embodiment of the present disclosure.
Figure 17B:
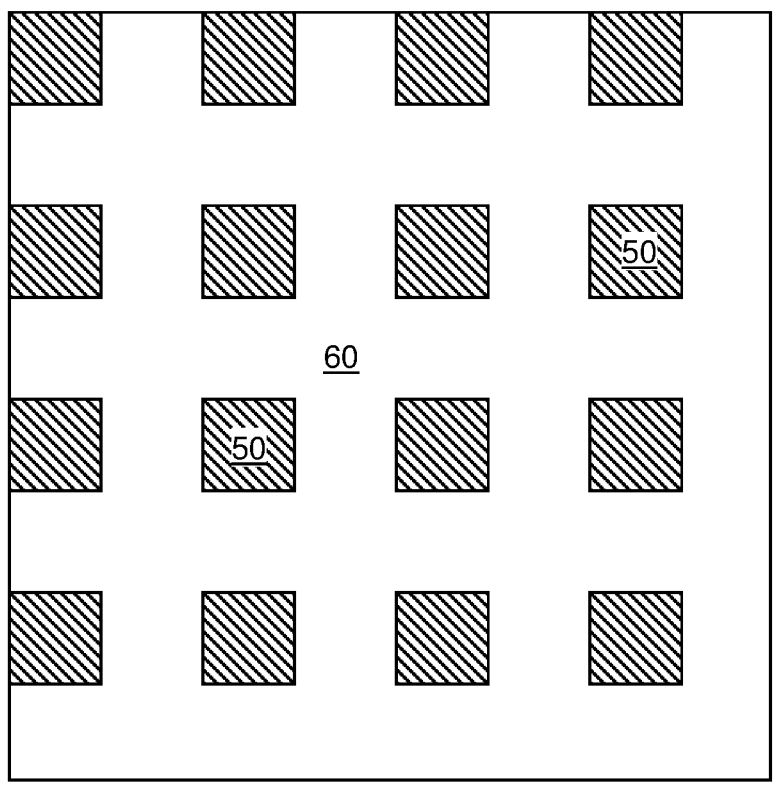
FIG. 17B is a top-down view of the second exemplary structure of FIG. 17A.

Referring to FIGS. 17A and 17B, the processing steps of FIGS. 8A and 8B can be performed to form a dielectric isolation structure 60.

Figure 18A:
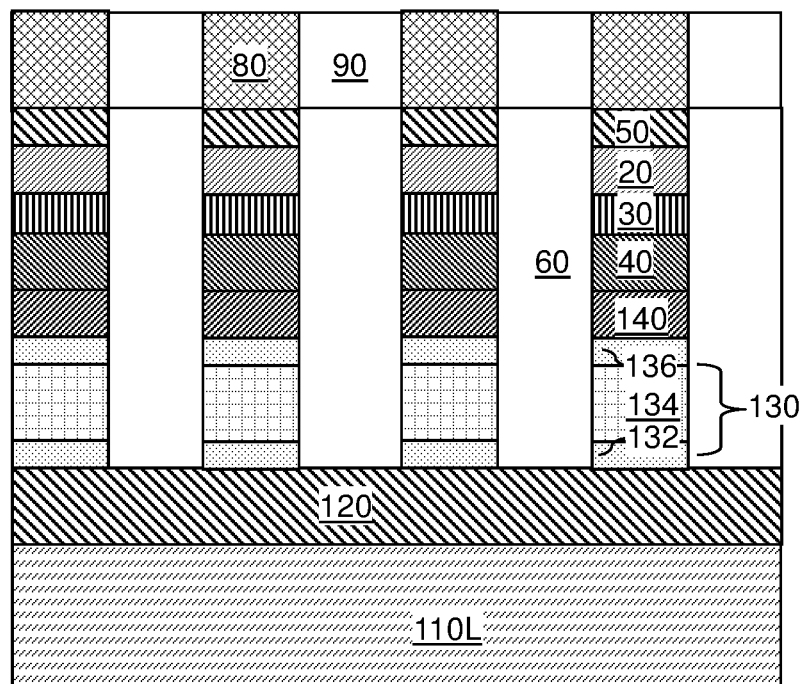
FIG. 18A is a vertical cross-sectional view of the second exemplary structure after formation of second electrically conductive lines laterally spaced by second dielectric rails according to the second embodiment of the present disclosure.
Figure 18B:
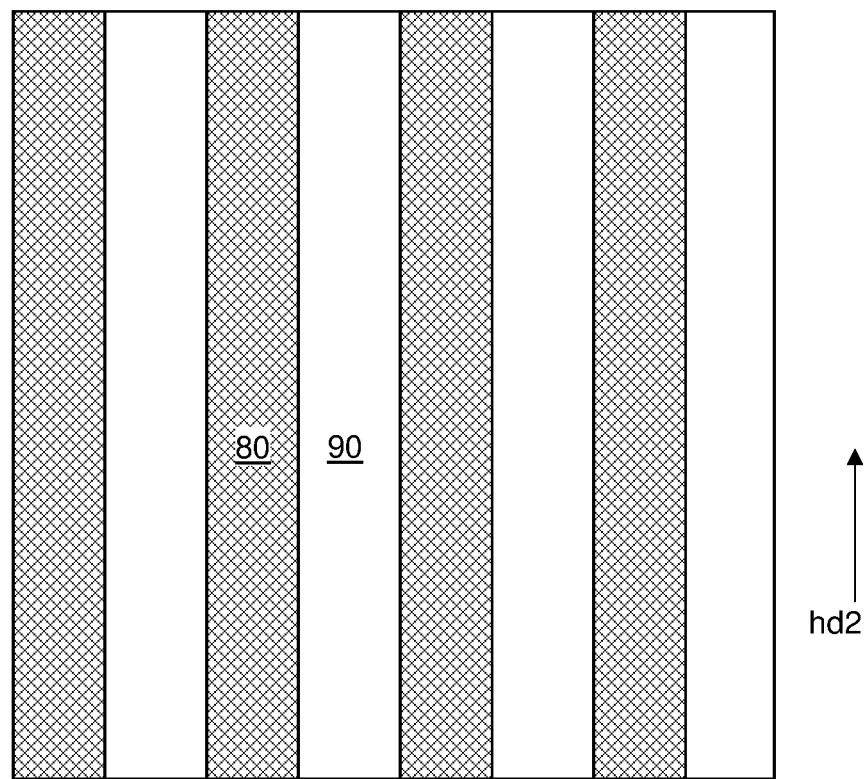
FIG. 18B is a top-down view of the second exemplary structure of FIG. 18A.

Referring to FIGS. 18A and 18B, the processing steps of FIGS. 9A and 9B can be performed to form second electrically conductive lines 80 and second dielectric rails 90.

Figure 19:
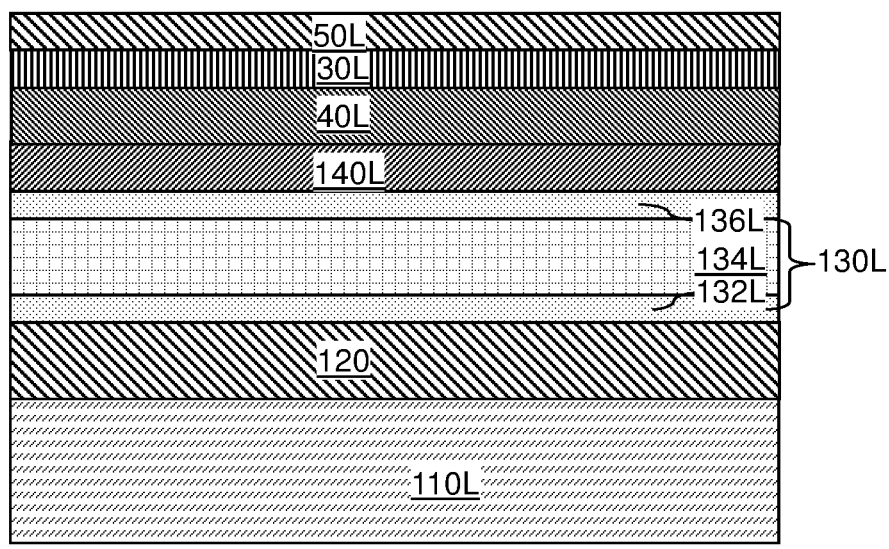
FIG. 19 is a vertical cross-sectional view of an alternative configuration of the second exemplary structure after removal of the single crystalline semiconductor layer according to the second embodiment of the present disclosure.

Referring to FIG. 19, an alternative configuration of the second exemplary structure can be derived from the second exemplary structure of FIG. 14 by removing the single crystalline semiconductor layer 20L selective to the material of the single crystalline ferroelectric material layer 30L. The metallic cap layer 50L can be deposited directly on the top surface of the single crystalline ferroelectric material layer 30L.

Figure 20A:
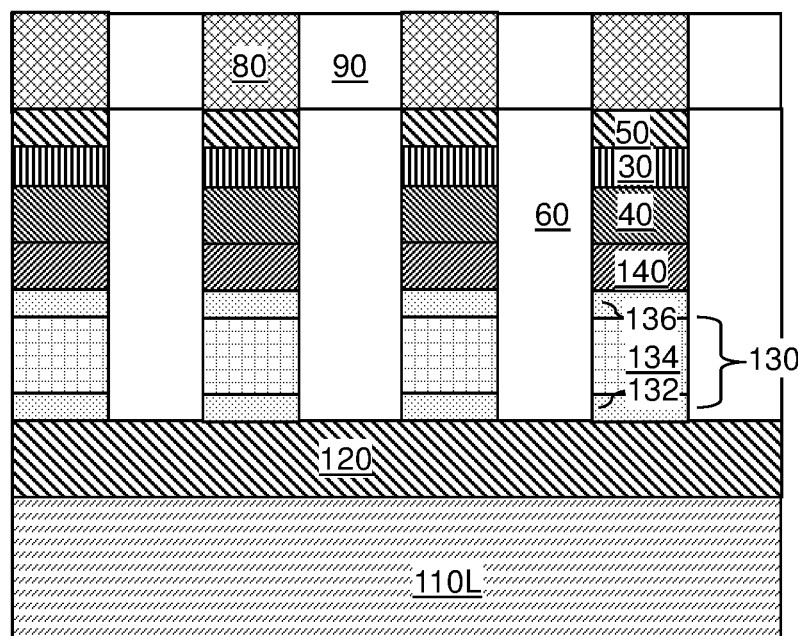
FIG. 20A is a vertical cross-sectional view of the alternative configuration of the second exemplary structure after formation of second electrically conductive lines laterally spaced by second dielectric rails according to the second embodiment of the present disclosure.
Figure 20B:
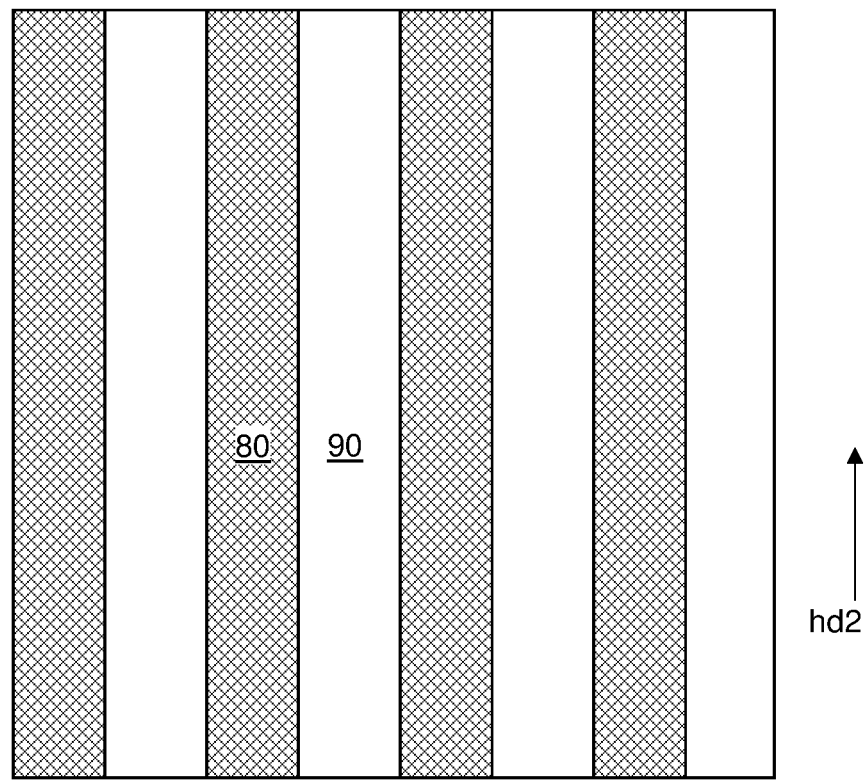
FIG. 20B is a top-down view of the second exemplary structure of FIG. 20A.

Referring to FIGS. 20A and 20B, the processing steps of FIGS. 16, 17A and 17B, and 18A and 18B can be performed to provide an alternative configuration of the second exemplary structure.

As shown in FIGS. 9A, 10A, 18A and 20A, a memory cell of a ferroelectric tunnel junction memory device according to the first and second embodiments is formed in each memory pillar structure. The memory cell of the ferroelectric tunnel junction memory device includes a ferroelectric tunneling dielectric layer which comprises the single crystalline ferroelectric material plate 30 located between lower and upper electrodes, which comprise the first metallic material plate 40 and the metallic cap plate 50, respectively. The single crystalline semiconductor plate 24 (if present, as shown in FIG. 9A) may comprise a portion of the upper electrode. The memory cell of the ferroelectric tunnel junction memory device may also include the selector element (e.g., steering element) 130. Each selector element 130 may include, from bottom to top, a lower electrode comprising the lower electrode plate 132, an upper electrode comprising the upper electrode plate 136 and a selector material (e.g., OTS or diode) comprising the selector material plate 134 located between the lower electrode 132 and the upper electrode 136. The conductive lines (120, 80) may comprise a respective bit line and word line of the memory cell.

The memory cell displays modulation in tunneling electrical resistance depending on the direction of polarization of the electric dipole moments in the ferroelectric tunneling dielectric layer 30. The direction of polarization of the electric dipole moments in the portion of the ferroelectric tunneling dielectric layer 30 can be programmed by applying a programming voltage across the ferroelectric tunneling memory element. The magnitude of the programming voltage can be selected such that the selector element 130 turns on under an external bias voltage having a magnitude of the programming voltage, and does not turn on under an external bias voltage of less than the magnitude of the programming voltage (e.g., one half of the magnitude of the programming voltage). The programming voltage applied to the bit line relative to the word line can have a magnitude that is sufficient to turn on the selector element 130, and can be positive or negative depending on the target direction of polarization of the electric dipole moments in the programmed portion of the ferroelectric tunneling dielectric layer 30.

The sensing of the direction of the electric dipole moments in the portion of the ferroelectric tunneling dielectric layer 30 between a selected bit line and a selected word line can be effected by applying a sensing voltage between the selected bit line and the selected word line. The magnitude of the sensing voltage can be selected such that the selector element 130 turns on under an external bias voltage having a magnitude of the sensing voltage, and does not turn on under an external bias voltage less than the magnitude of the sensing voltage (e.g., one half of the magnitude of the sensing voltage). Further, the magnitude of the sensing voltage is lower than the magnitude of the programming voltage, and is insufficient to program a portion of the ferroelectric tunneling dielectric layer 30. In one embodiment, the magnitude of the sensing voltage can be about 50 mV~200 mV higher than the turn-on voltage for the selector element 130. The selected portion of the ferroelectric tunneling dielectric layer 30 provides modulation of electrical resistance depending on the direction of the polarization of the electric dipole moments. Thus, a selected portion of a ferroelectric tunneling dielectric layer 30 between a selected bit line and a selected word line in an array can be sensed without disturbing unselected memory cells.

Figures 21A, 21B:
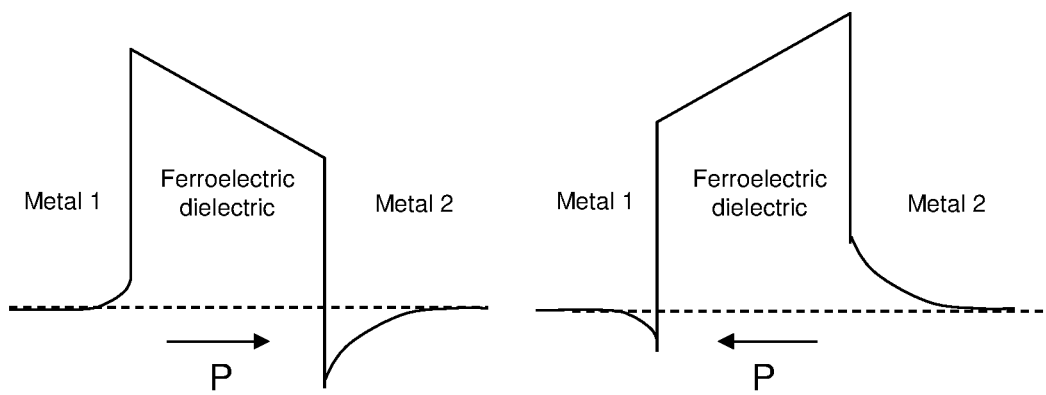
FIGS. 21A and 21B are schematic diagrams of electrostatic potential energy band profiles of ferroelectric tunnel junction devices of the first and second embodiments of the present disclosure.

Referring to FIGS. 21A and 21B, electrostatic potential energy band profiles are illustrated for a ferroelectric tunnel junction devices of the first and second embodiments. The devices include a first conductor, a tunneling ferroelectric dielectric, and a second conductor for two different polarization directions of the tunneling ferroelectric dielectric. The first conductor and the second conductor can be different, and the magnitude and the lateral extent of the distortion in the conduction band due to the dipole moment P in the ferroelectric tunneling dielectric can be asymmetric. The asymmetric band modulations induced in the ferroelectric tunnel junction can change the tunneling electrical resistance of the ferroelectric tunnel junction depending on the direction of the electric dipole moment in the ferroelectric tunneling dielectric. Generally, polarization reversal of a ferroelectric tunnel junction can modulate a tunnel transmission coefficient induced by two different average barrier heights. Thus, electrostatic potential energy band profiles for the two different polarization states of the ferroelectric tunneling dielectric provide two different electrical resistance states, which can be employed to program and store a data bit. The ratio of the conductance in the low electrical resistance state to the conductance in the high resistance state can be in a range from 10 to 1,000, such as from 30 to 300, although lesser and greater ratios may also be employed. The polarization state of the ferroelectric tunneling dielectric exhibits a hysteresis curve as a function of an external voltage bias across the first conductor and the second conductor, and is capable of storing a data bit. The programmable resistance states of a ferroelectric tunnel junction is used in various ferroelectric memory devices of the first and second embodiments of the present disclosure.

Referring to all drawings and according to the first and second embodiments of the present disclosure, a memory device comprises a first electrically conductive line 120 laterally extending along a first horizontal direction hd1, a memory pillar structure (130, 140, 40, 30, optionally 24, 50) overlying and contacting the first electrically conductive line 120, wherein the memory pillar structure comprises a single crystalline ferroelectric material plate 30 in which an entirety of a ferroelectric material is single crystalline, and a second electrically conductive line 80 laterally extending along a second horizontal direction hd2 and overlying and contacting the memory pillar structure.

In one embodiment, the memory pillar structure (130, 140, 40, 30, optionally 24, 50) comprises a first metallic material plate 40 contacting a bottom surface of the single crystalline ferroelectric material plate 30. In one embodiment, the memory pillar structure (130, 140, 40, 30, optionally 24, 50) further comprises a selector material plate 134 underlying the first metallic material plate 40. A bonding interface is located between the selector material plate 134 and the single crystalline ferroelectric material plate 30. The bonding interface may be located between the first metallic material plate 40 and the second metallic material layer 140.

In one embodiment, the memory device comprises: a lower electrode plate 132 contacting a bottom surface of the selector material plate 134 and comprising a first non-metallic conductive material; and an upper electrode plate 136 contacting a top surface of the selector material plate 134 and comprising a second non-metallic conductive material. In one embodiment, the selector plate comprises an ovonic threshold switch material. In one embodiment, each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

In one embodiment, the memory pillar structure (130, 140, 40, 30, optionally 24, 50) comprises a second metallic material plate 140 contacting a bottom surface of the first metallic material plate 40 and bonded to the first metallic material plate 40. In one embodiment, the ferroelectric material of the single crystalline ferroelectric material plate 30 comprises doped or undoped hafnium oxide having an orthorhombic phase.

In one embodiment, the memory pillar structure (130, 140, 40, 30, optionally 24, 50) comprises a semiconductor plate (such as a single crystalline semiconductor plate 24) contacting a top surface of the single crystalline ferroelectric material plate 30. In one embodiment, the semiconductor plate comprises a single crystalline semiconductor material. In one embodiment, the single crystalline semiconductor material of the semiconductor plate is epitaxially aligned to the ferroelectric material of the single crystalline ferroelectric material plate 30. In one embodiment, the semiconductor plate comprises single crystalline germanium or silicon germanium.

In one embodiment, the memory pillar structure (130, 140, 40, 30, optionally 24, 50) comprises a metallic cap plate 50 overlying the single crystalline ferroelectric material plate 30 and contacting the second electrically conductive line 80. In one embodiment, the memory device comprises a ferroelectric tunnel junction memory device.

The first and second embodiments of the present disclosure provide a single crystalline ferroelectric tunneling dielectric layer in a ferroelectric tunnel junction (FTJ) memory device which provides superior ferroelectric properties due to the single crystalline structure. Furthermore, an easy to deposit single crystal semiconductor layer can be used as an epitaxial template for a hafnium oxide based single crystalline ferroelectric tunneling dielectric layer instead of a more difficult to deposit perovskite template layer.

In a third embodiment of the present disclosure, the memory material layer comprises a phase change memory material layer rather than a ferroelectric tunneling dielectric layer, and the memory device comprises a phase change memory (PCM) device, such as a phase change random access memory ("PCRAM" or "PRAM") device rather than a FTJ memory device. The phase change memory material layer may be damaged by the reactive ion etch (RIE) used to pattern thick overlying word or bit lines. Therefore, in the third embodiment, the phase change memory material layer is formed over a first set of patterned lines (e.g., word lines or bit lines) located over a first substrate. The first set of patterned lines are patterned by RIE prior to deposition of the phase change memory material layer. The second set of patterned lines (e.g., the other ones of the word lines or bit lines) are formed over a second substrate followed by bonding the second set of patterned lines to a layer stack containing the phase change memory material layer. In the third embodiment, the phase change memory material layer is not exposed to an extended reactive etch process which etches the thick conductive lines. This reduces or prevents damage of the phase change memory material layer.

Figure 22A:
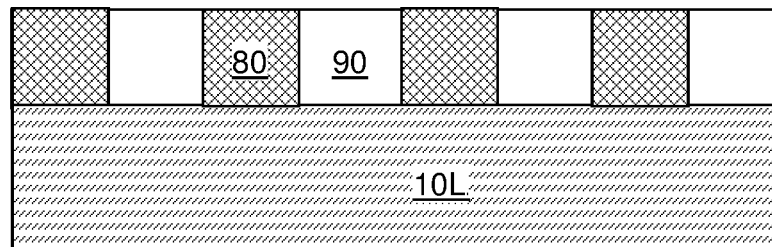
FIGS. 22A, 23, 24, 25A, 26 and 27 are vertical cross-sectional views of steps in a method of forming a third exemplary structure according to the third embodiment of the present disclosure.
Figure 22B:
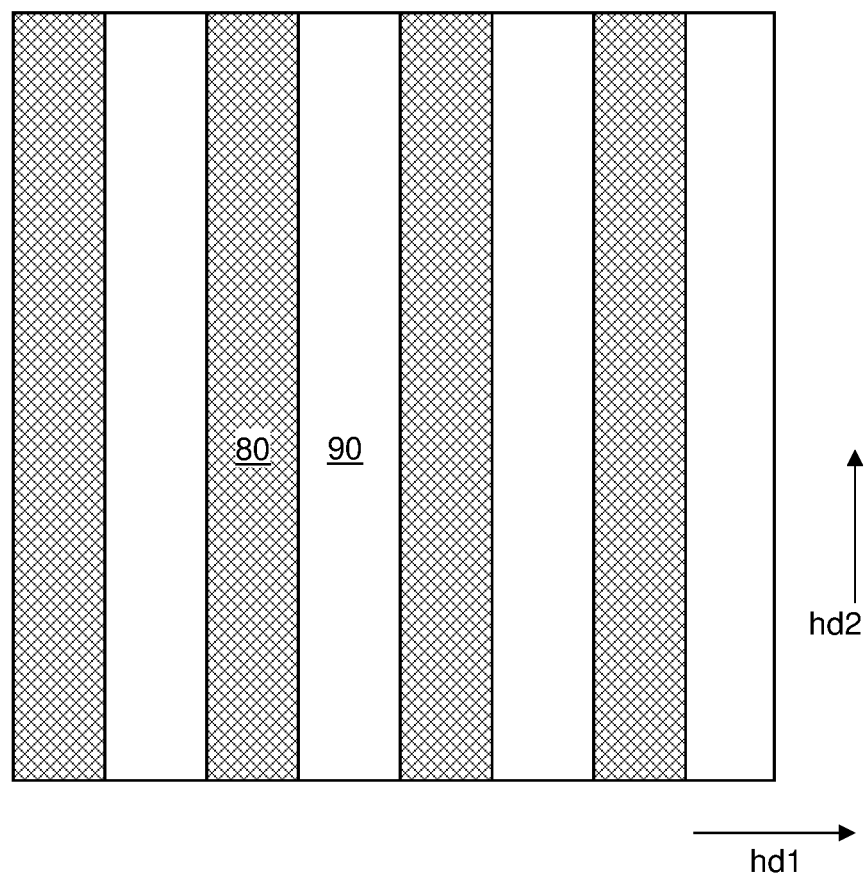
FIGS. 22B and 25B are top-down views of the third exemplary structure of FIGS. 22A and 25A, respectively.

Referring to FIGS. 22A and 22B, the second electrically conductive lines 80 and the second dielectric material rails 90 are formed over the first substrate 10L. The second electrically conductive lines 80 may be formed by depositing one or more electrically conductive layers described in the prior embodiments, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Figure 23:
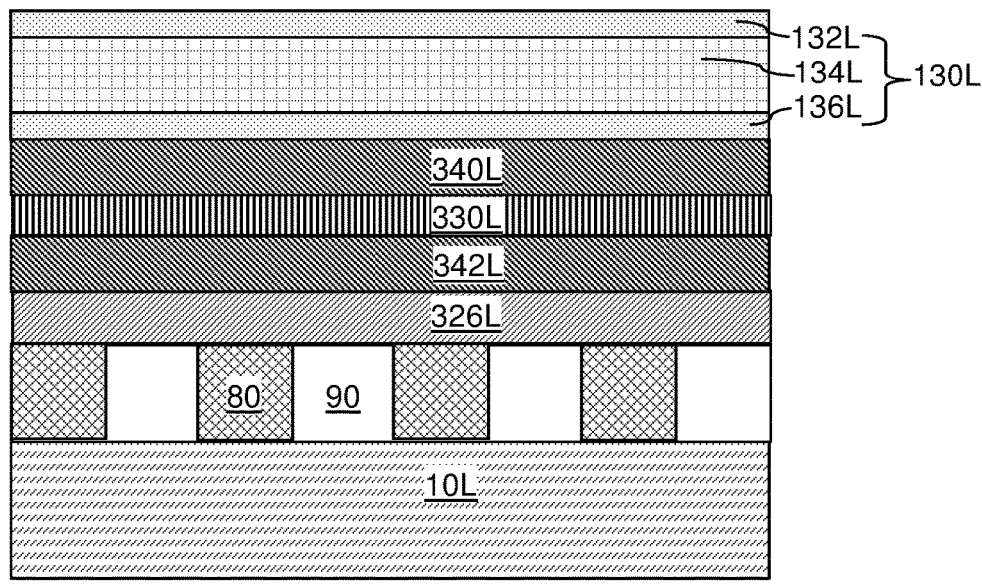

Referring to FIG. 23, a layer stack is formed over the second electrically conductive lines 80 and the second dielectric material rails 90 located over the first substrate 10L. The layer stack includes a non-metallic conductive material layer 326L. Exemplary non-metallic conductive materials that can be employed for layer 326L include amorphous carbon, amorphous boron-doped carbon, or amorphous nitrogen-doped carbon. The non-metallic conductive material layer 326L thickness in a range from 10 nm to 50 nm, such as from 20 nm to 30 nm, although lesser and greater thicknesses may also be employed.

A relatively thin second metallic material layer 342L can be formed by deposition of a second metallic material on the top surface of the non-metallic conductive material layer 326L. The second metallic material layer 342L may include an elemental metal, such as W or Ru, and/or a conductive metallic compound material, such as TiN, TaN, or WN. The second metallic material layer 342L can be formed by chemical vapor deposition or by physical vapor deposition. The second metallic material layer 342L can have a thickness in a range from 1 nm to 5 nm, such as from 2 nm to 3 nm, although lesser and greater thicknesses may also be employed.

A memory material layer comprising a phase change memory material layer 330L is formed on the second metallic material layer 342. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. In this case, the thickness of the at least one memory material layer 15L can be in a range from 10 nm to 60 nm, such as from 20 nm to 50 nm and/or from 25 nm to 35 nm, although lesser and greater thicknesses can also be employed.

A relatively thin first metallic material layer 340L can be formed by deposition of a first metallic material on the top surface of the phase change memory material layer 330L. The first metallic material layer 340L may include an elemental metal, such as W or Ru, and/or a conductive metallic compound material, such as TiN, TaN, or WN. The first metallic material layer 340L can be formed by chemical vapor deposition or by physical vapor deposition. The first metallic material layer 340L can have a thickness in a range from 1 nm to 5 nm, such as from 2 nm to 3 nm, although lesser and greater thicknesses may also be employed.

The stack of the selector-level layers 130L is formed over the first metallic material layer 340L. The selector-level layers 130L include the same layers as in the first embodiment (i.e., the lower electrode layer 132L, the selector material layer 134L, and the upper electrode layer 136L stacked up-side down compared to the first and second embodiments), and will not be described in more detail with respect to this third embodiment.

Figure 24:
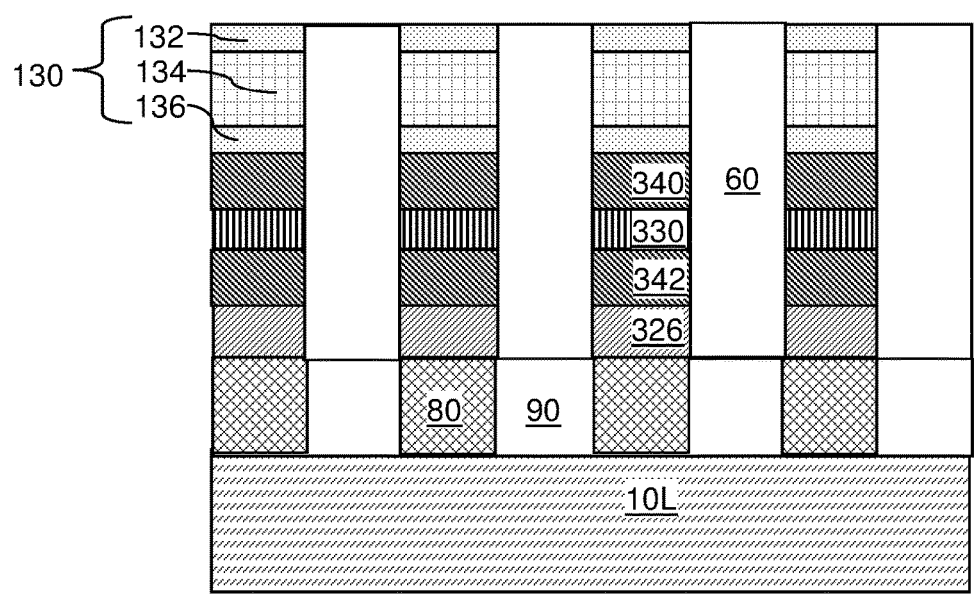

Referring to FIG. 24, the above described layers (326L, 342L, 330L, 340L and 130L) are then patterned into memory pillar structures (326, 342, 330, 340 and 130) each of which contains a respective PRAM memory cell (330, 340, 342). Any suitable patterning method, such as photolithography and etching may be used to form the memory pillar structures, as described above with respect to the first and second embodiments. The etching process used to etch the memory pillar structures may be selected such that it does not significantly damage the phase change memory material layer 130L. The dielectric isolation structure 60 is then formed such that it laterally surrounds the two-dimensional array of memory pillar structures (326, 342, 330, 340 and 130).

Each memory pillar structure (326, 342, 330, 340 and 130) comprises a phase change memory material plate 330 located between first and second electrode plates (340, 342) of the PRAM memory cell (330, 340, 342). A non-metallic conductive material plate 326 is located between the second electrode 342 and the second electrically conductive lines 80 (i.e., word lines or bit lines). A selector element 130 is located above the first electrode plate 340. The selector element includes a selector material plate 134 located between first and second electrode plates (132, 136) of the selector element 130.

Figure 25A:
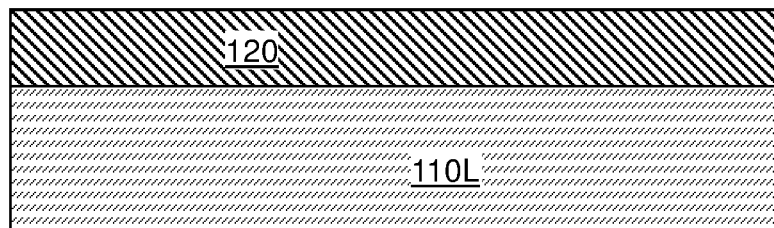
Figure 25B:
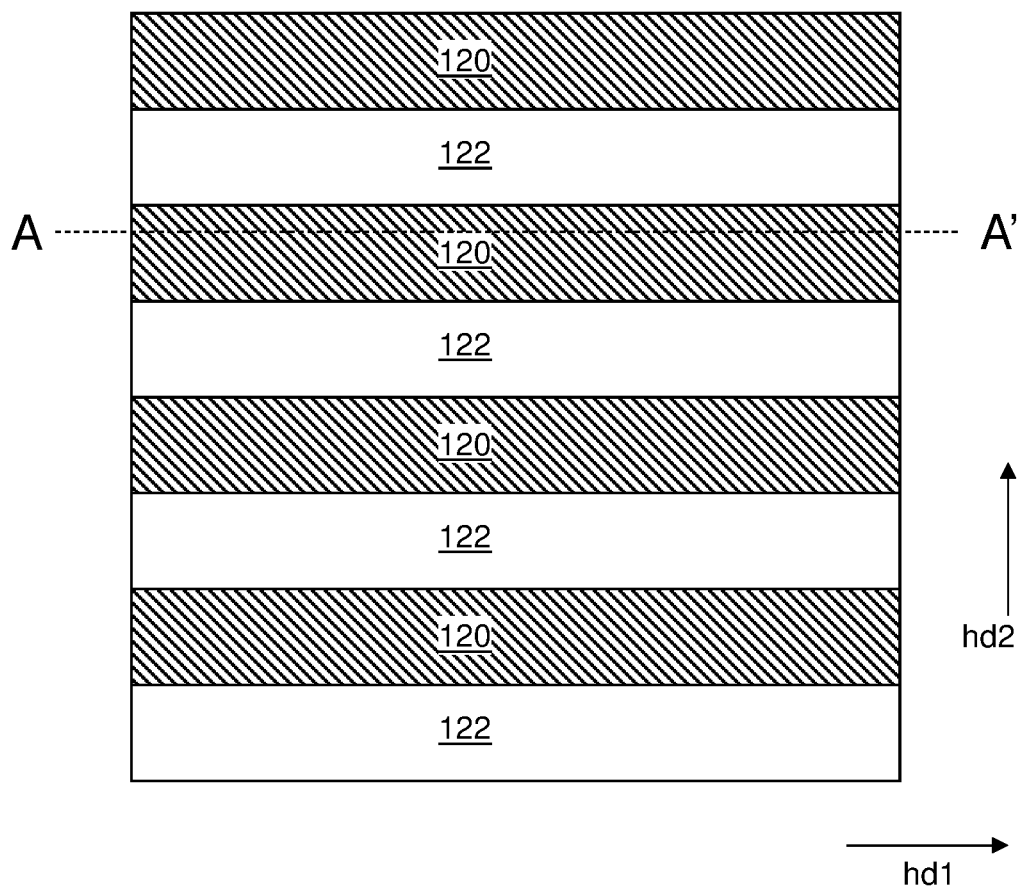

Referring to FIGS. 25A and 25B, the first electrically conductive lines 120 may be formed by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 26:
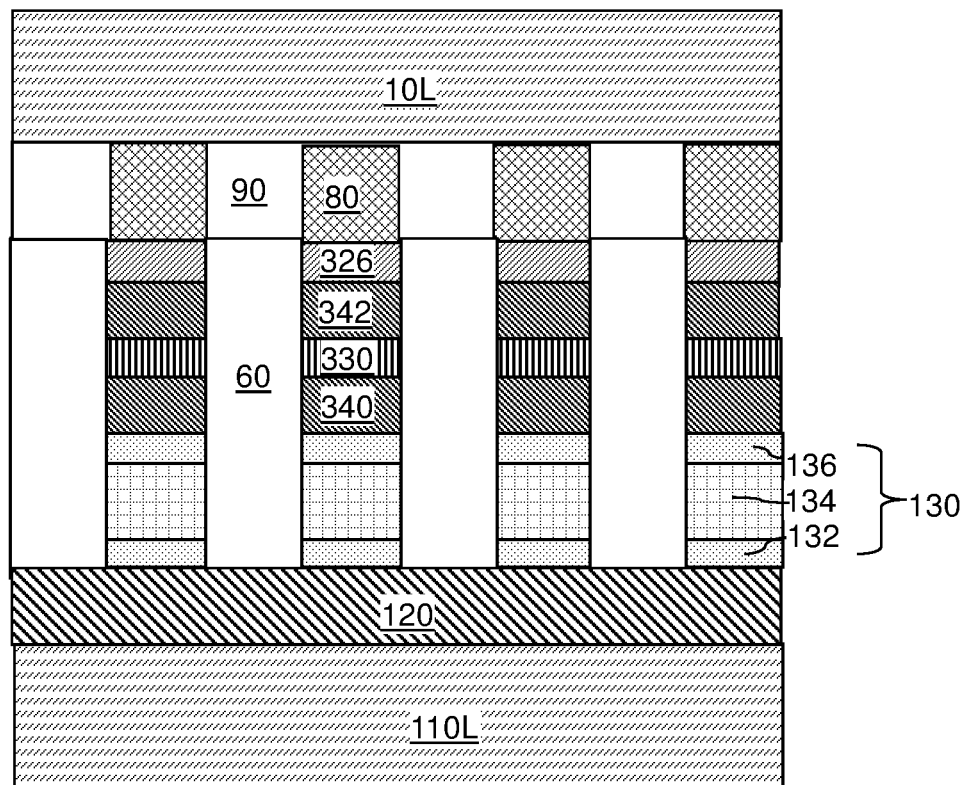

Referring to FIG. 26, the first electrically conductive lines 120 and the first dielectric rails 122 located over the second substrate 110L are bonded to the dielectric isolation structure 60 and the array of memory pillar structures (326, 342, 330, 340 and 130) located over the first substrate 10L. Any suitable bonding may be used, such as metal to metal bonding, dielectric to dielectric bonding, or a combination thereof (i.e., hybrid bonding) may be used.

Figure 27:
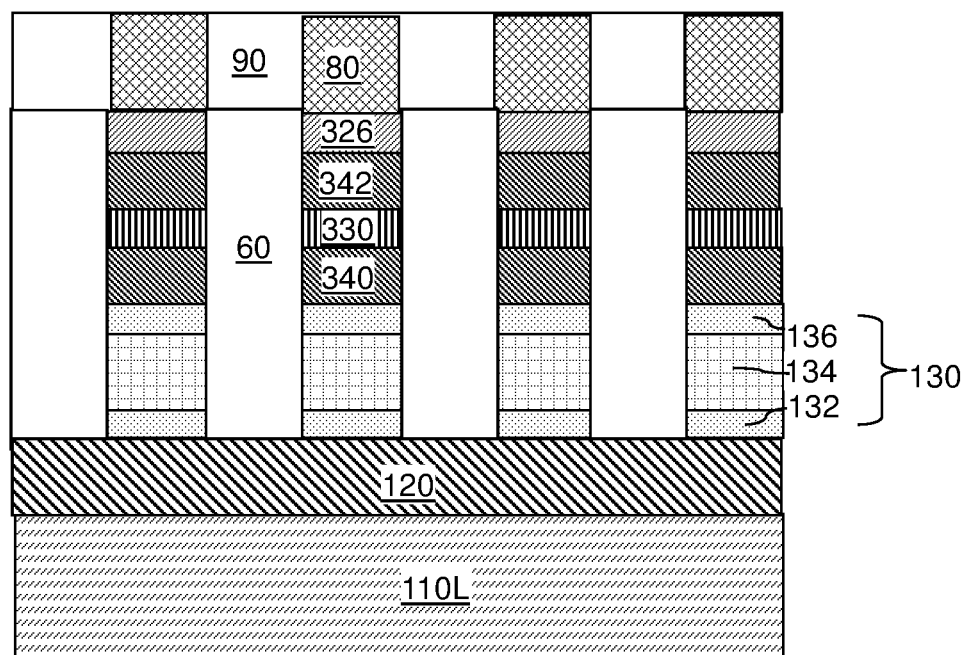

Referring to FIG. 27, the first substrate 10L may optionally be removed from the second electrically conductive lines 80 and reused to form additional memory devices. The first substrate may be removed by any suitable method. For example, the first substrate 10L may be removed by implanting hydrogen or deuterium into the bottom of the first substrate to form an implanted layer followed by annealing the first substrate to cleave the first substrate along the implanted layer, similar to the method described in the first embodiment. Alternatively, the first substrate 10L may be removed by grinding and polishing, as described in the second embodiment. Alternatively, a release layer (e.g., silicon oxide or silicon nitride layer) may be formed between the first substrate 10L and the second electrically conductive lines 80, followed by selectively etching the release layer to remove the first substrate 10L.

In a fourth embodiment of the present disclosure, the memory device comprises a magnetoresistive random access memory ("MRAM") device rather than a FTJ memory device. Each memory cell of the MRAM device may contain a magnetic tunnel junction (MTJ). In one embodiment, the MRAM device may comprised a spin-transfer torque (STT) type MRAM device.

The MTJ may be damaged by the reactive ion etch (RIE) used to pattern thick overlying word or bit lines. Therefore, in the fourth embodiment, the MTJ is formed over a first set of patterned lines (e.g., word lines or bit lines) located over a first substrate. The first set of patterned lines are patterned by RIE prior to deposition of the MTJ. The second set of patterned lines (e.g., the other ones of the word lines or bit lines) are formed over a second substrate followed by bonding the second set of patterned lines to a layer stack containing the MTJ. In the fourth embodiment, the MTJ is not exposed to an extended reactive etch process which etches thick conductive lines. This reduces or prevents damage of the MTJ.

Figure 28A:
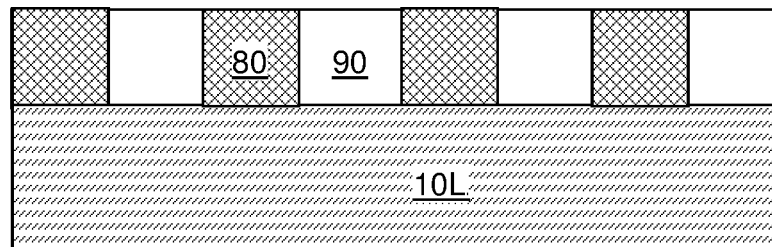
FIGS. 28A, 29, 30, 31A, 32 and 33 are vertical cross-sectional views of steps in a method of forming a fourth exemplary structure according to the fourth embodiment of the present disclosure.
Figure 28B:
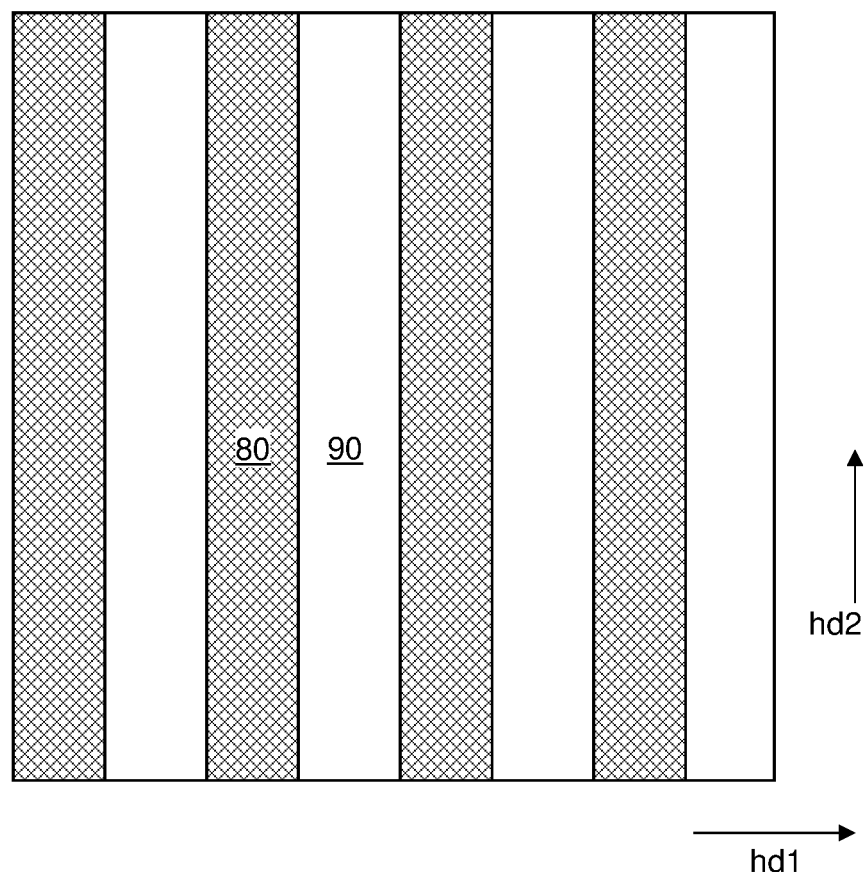
FIGS. 28B and 31B are top-down views of the fourth exemplary structure of FIGS. 28A and 31A, respectively.

Referring to FIGS. 28A and 28B, the second electrically conductive lines 80 and the second dielectric material rails 90 are formed over the first substrate 10L. The second electrically conductive lines 80 may be formed by depositing one or more electrically conductive layers described in the prior embodiments, followed by patterning the one or more electrically conductive layers by reactive ion etching (RIE) to form the lines 80. The second dielectric rails 90 are then formed between the second electrically conductive lines 80 by depositing the dielectric material layer between the second electrically conductive lines 80 and planarizing the dielectric material layer.

Figure 29:
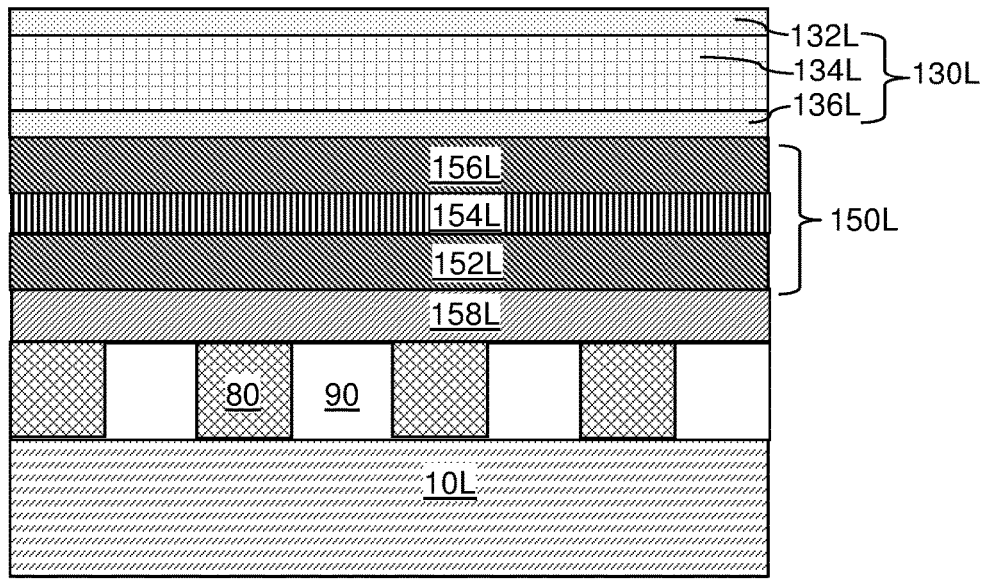

Referring to FIG. 29, a layer stack including an optional metallic cap layer 158L and a MTJ stack 150L is formed over the second electrically conductive lines 80 and the second dielectric material rails 90 located over the first substrate 10L. The stack includes, from bottom to top or from top to bottom, the metallic cap layer 158L, a reference layer 152L (which is also referred to as a magnetic pinned layer), a tunnel barrier layer 154L, and a free layer 156L, which together form an MTJ stack 150L of the STT MRAM memory cell. The thickness of the MTJ can be in a range from 10 nm to 40 nm, such as 20 nm to 30 nm.

The metallic cap layer 158L includes a nonmagnetic metallic material such as at least one nonmagnetic transition metal or a nonmagnetic transition metal alloy. For example, the metallic cap layer 158L may include, and or may consist essentially of, Ti, V, Cr, Mn, Zr, Nb, Mo, Tc, Ru, Rh, Hf, Ta, W, Re, Os, Jr, alloys thereof, or a conductive metallic nitride (e.g., TaN) or a conductive metallic carbide thereof. The metallic cap layer 158L maybe deposited by physical vapor deposition or chemical vapor deposition. The thickness of the metallic cap layer 158L may be in a range from 1 nm to 20 nm, such as from 2 nm to 10 nm, although lesser and greater thicknesses can also be employed.

The reference layer 152L can have a fixed magnetization direction which can be a horizontal direction or a vertical direction. The reference layer 152L can be formed as single ferromagnetic material layer or multiple ferromagnetic material layers that are magnetically coupled among one another to provide a same magnetization direction throughout. The reference layer 152L may include a Co/Ni multilayer structure or a Co/Pt multilayer structure. In one embodiment, the reference layer 152L can additionally include a thin non-magnetic layer comprised of tantalum or tungsten having a thickness in a range from 0.2 nm to 0.5 nm and a thin CoFeB layer having a thickness in a range from 0.5 nm to 3 nm. The thickness of the reference layer 152L can be in a range from 2 nm to 5 nm.

Optionally, the reference layer 152L may be provided in a synthetic antiferromagnet (SAF) structure that includes a hard magnetization layer (not expressly shown), an antiferromagnetic coupling layer (e.g., a Ru layer, not expressly shown), and the reference layer 152L. In case the reference layer 152L is provided as a component of an SAF structure, the magnetization of the hard magnetization layer and the magnetization of the magnetic pinned layer can be antiferromagnetically coupled through the antiferromagnetic coupling layer.

The tunnel barrier layer 154L can include a tunnel barrier dielectric material such as magnesium oxide or aluminum oxide. The tunnel barrier layer 154L can have a thickness in a range from 0.6 nm to 2 nm, such as from 0.8 nm to 1.2 nm. The tunnel barrier layer 154L contacts the reference layer 152L, and provides spin-sensitive tunneling of electrical currents between the reference layer 152L and the free layer 156L. In other words, the amount of electrical current that passes through the tunnel barrier layer 154L depends on the relative alignment of magnetization between the reference layer 152L and the free layer 156L, i.e., whether the magnetization directions are parallel or antiparallel to each other.

The free layer 156L can be formed as single ferromagnetic material layer or multiple ferromagnetic material layers that are magnetically coupled among one another to provide a same magnetization direction throughout. The thickness of the free layer 156L is less than 2 nm, and preferably less than 1.5 nm, such as from 0.8 nm to 1.5 nm. For example, the free layer 156L can include a CoFeB layer and/or a CoFe layer. The free layer 156L can be programmed by flowing electrical current along a vertical direction either upward or downward. Additional layers (not shown) may be included in the MTJ 150.

The stack of the selector-level layers 130L is formed over the MTJ stack 150L. The selector-level layers 130L include the same layers as in the first embodiment (i.e., the lower electrode layer 132L, the selector material layer 134L, and the upper electrode layer 136L stacked up-side down compared to the first and second embodiments), and will not be described in more detail with respect to this fourth embodiment. The order of deposition of the metallic cap layer 158L and the stack of the selector-level layers 130L may be reversed, such that the stack of the selector-level layers 130L is formed between the MTJ stack 150L and the first substrate 10L, while the metallic cap layer 158L is formed over the MTJ stack 150L.

Figure 30:
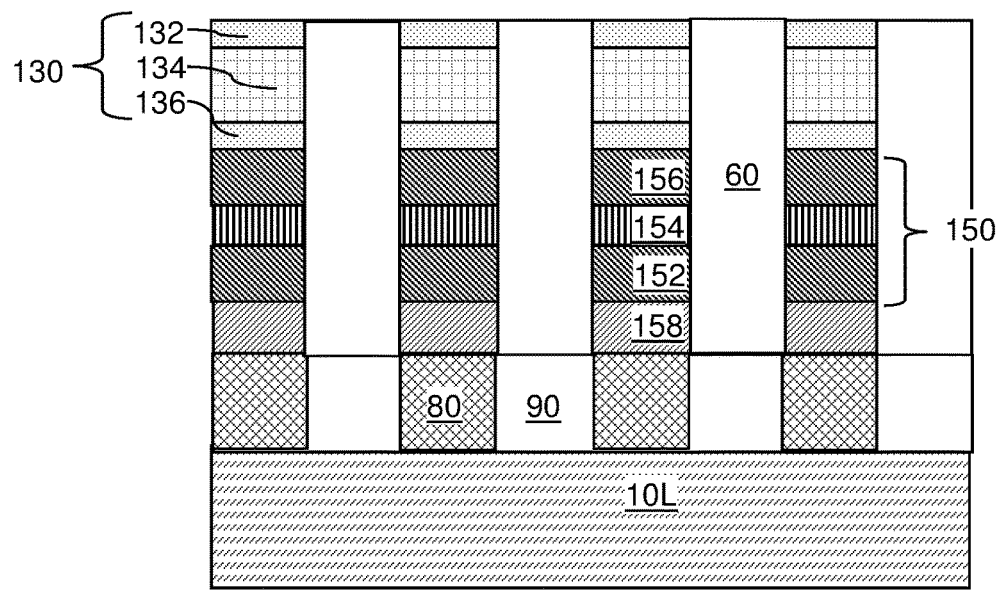

Referring to FIG. 30, the above described layers (158L, 152L, 154L, 156L, and 130L) are then patterned into memory pillar structures (158, 152, 154, 156, and 130). Any suitable patterning method may be used. For example, photolithography and etching may be used to pattern the stack of the selector-level layers 130L, while ion beam milling may be used to pattern the MTJ stack 150L and the metallic cap layer 158L to form the MTJ 150 and a metallic cap plate 158. The dielectric isolation structure 60 is then formed such that it laterally surrounds the two-dimensional array of memory pillar structures (158, 152, 154, 156, and 130).

Each memory pillar structure (158, 152, 154, 156, and 130) comprises a MRAM memory cell containing the MTJ 150 in which the tunnel barrier plate 154 located between the reference layer plate 152 and the free layer plate 156. The metallic cap plate 158 is located on one side of the MTJ 150. A selector element 130 is located above or below the MTJ 150. The selector element includes a selector material plate 134 located between first and second electrode plates (132, 136) of the selector element 130.

Figure 31A:
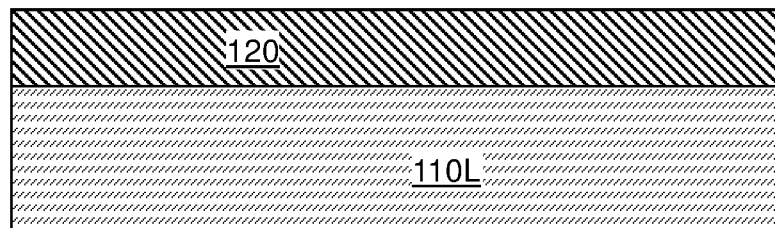
Figure 31B:
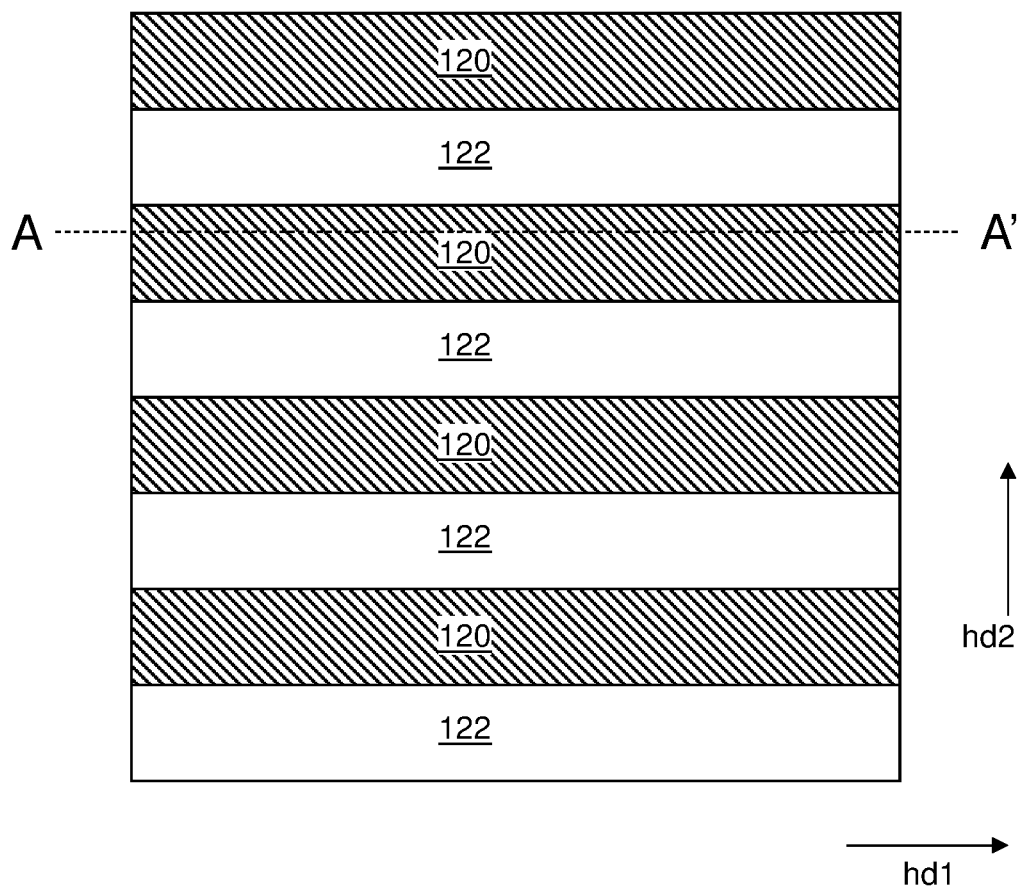

Referring to FIGS. 31A and 31B, the first electrically conductive lines 120 may be formed by depositing one or more electrically conductive layers over the second substrate 110L, followed by patterning the one or more electrically conductive layers by reactive ion etching (RIE) to form the lines 120. The first dielectric rails 122 are then formed between the first electrically conductive lines 120 by depositing the dielectric material layer between the first electrically conductive lines 120 and planarizing the dielectric material layer.

Figure 32:
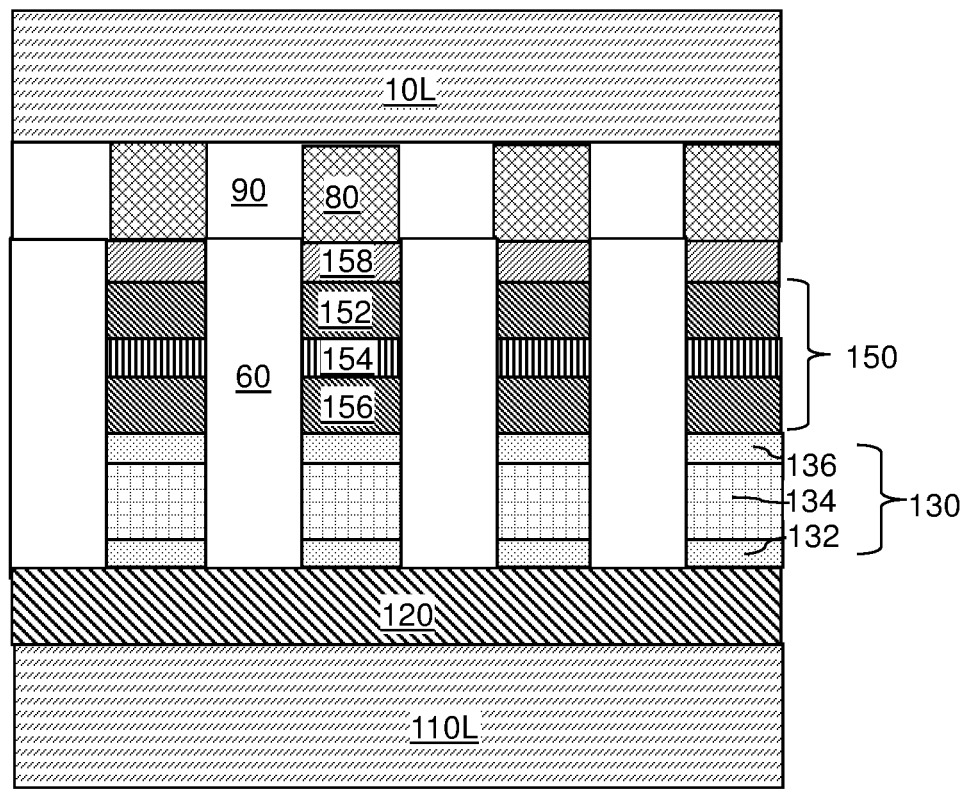

Referring to FIG. 32, the first electrically conductive lines 120 and the first dielectric rails 122 located over the second substrate 110L are bonded to dielectric isolation structure 60 and the array of memory pillar structures (158, 152, 154, 156, and 130) located over the first substrate 10L. Any suitable bonding may be used, such as metal to metal bonding, dielectric to dielectric bonding, or a combination thereof (i.e., hybrid bonding) may be used.

Figure 33:
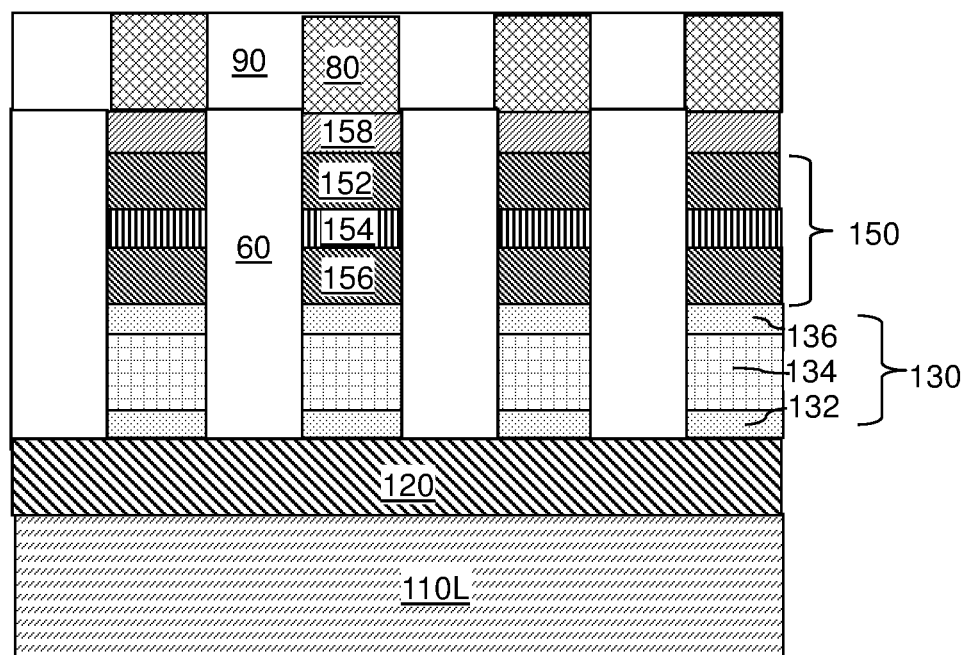

Referring to FIG. 33, the first substrate 10L may optionally be removed from the second electrically conductive lines 80 and reused to form additional memory devices. The first substrate may be removed by any suitable method. For example, the first substrate 10L may be removed by implanting hydrogen or deuterium into the bottom of the first substrate to form an implanted layer followed by annealing the first substrate to cleave the first substrate along the implanted layer, similar to the method described in the first embodiment. Alternatively, the first substrate 10L may be removed by grinding and polishing, as described in the second embodiment. Alternatively, a release layer (e.g., silicon oxide or silicon nitride layer) may be formed between the first substrate 10L and the second electrically conductive lines 80, followed by selectively etching the release layer to remove the first substrate 10L.

Figure 34:
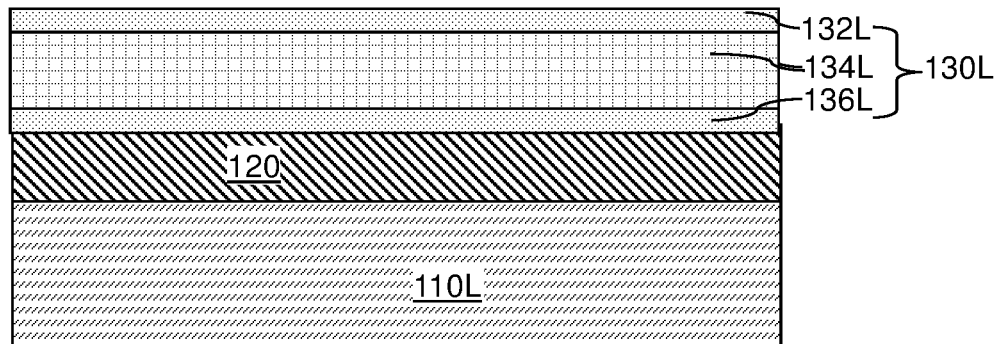
FIGS. 34, 35, 36, 37, 38 and 39 are vertical cross-sectional views of steps in a method of forming an alternative configuration of the fourth exemplary structure according to an alternative aspect of the fourth embodiment of the present disclosure.
Figure 35:
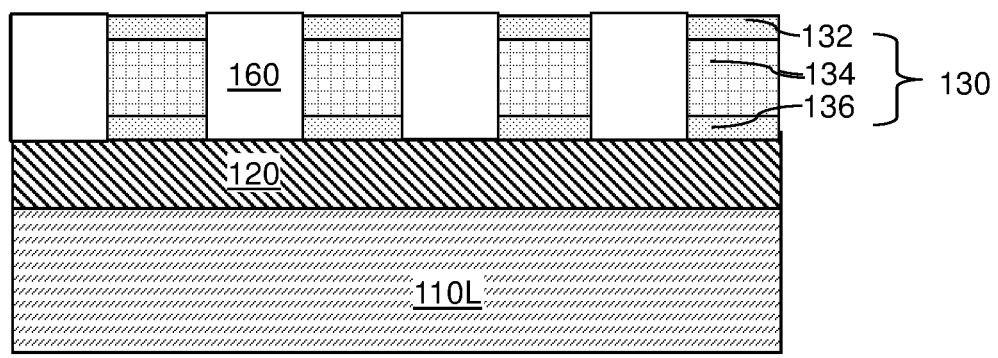

In a first alternative aspect of the fourth embodiment shown in FIG. 34, the stack of the selector-level layers 130L are formed over the first electrically conductive lines 120 located over the second substrate 110L instead of being formed over the MTJ stack 150L located over the first substrate 10L. If desired, the stack of the selector-level layers 130L may be patterned (e.g., by photolithography and etching) into selector elements 130 while located over the second substrate 100L, as shown in FIG. 35. A dielectric isolation structure 160 is then formed to surround the selector elements 130.

Figure 36:
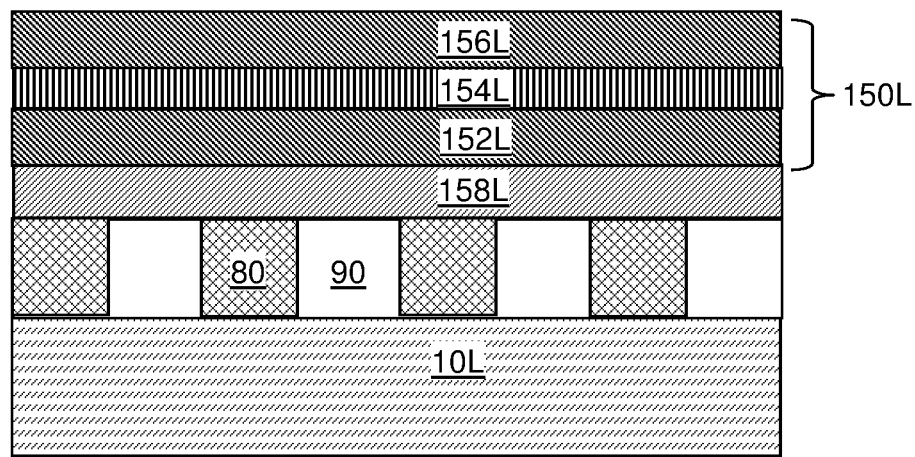
Figure 37:
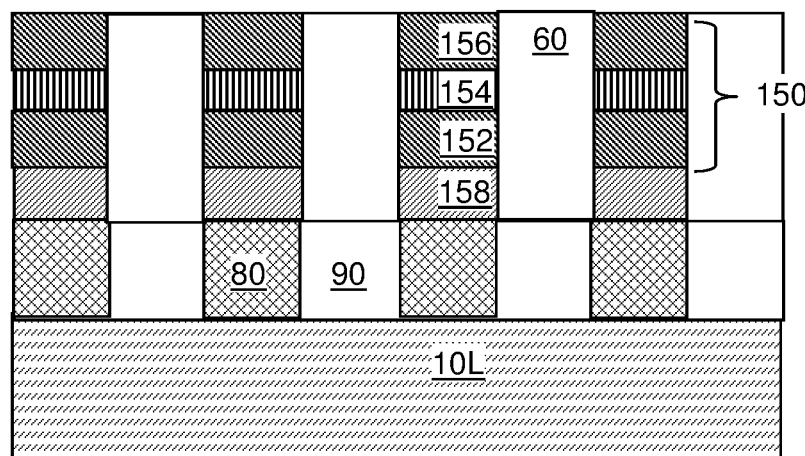

In this alternative aspect, the MTJ stack 150L and the optional metallic cap layer 158L are formed over the second electrically conductive lines 80 located over the first substrate 10L, as shown in FIG. 36. The MTJ stack 150L and the metallic cap layer 158L are patterned (e.g., by ion beam milling) while they are located over the first substrate 10L, as shown in FIG. 37 and as described above with respect to FIG. 24. A dielectric isolation structure 60 is then formed to surround the MTJ 150 pillars.

Figure 38:
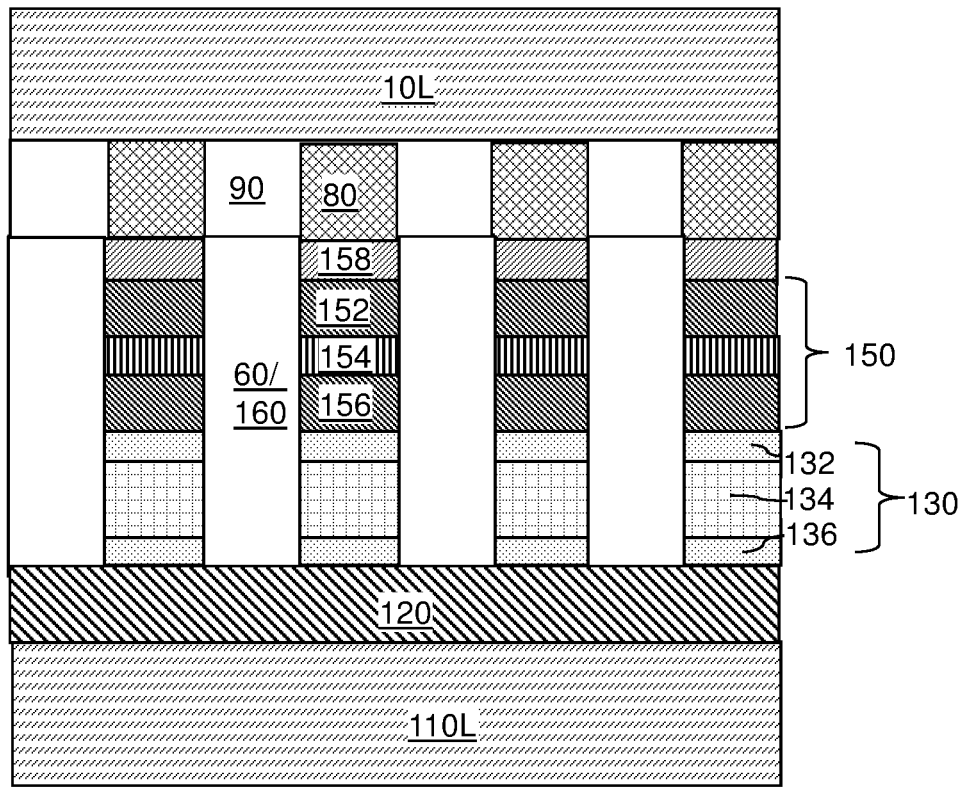

Then, as shown in FIG. 38, a second assembly comprising the stack of the selector-level layers 130L, the first electrically conductive lines 120 and the second substrate 110L is bonded to the first assembly containing the second electrically conductive lines 80, at least a portion of a memory cell (e.g., the MTJ 150) and the first substrate 10L. The MTJ 150 is located between the word lines and the bit lines after the bonding.

Figure 39:
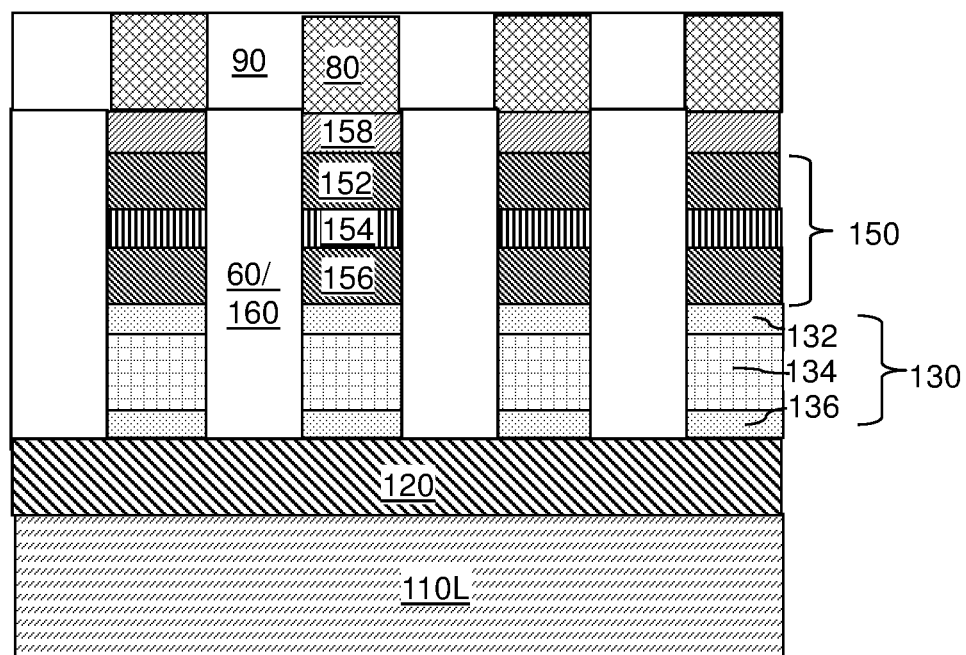

Finally, as shown in FIG. 39, the first substrate 10L is then removed. Each respective MTJ 150 forms a memory cell located in the same memory pillar structure (130, 150, 158) as its respective selector element 130.

In other alternative aspects of the fourth embodiment, the stack of the selector-level layers 130L may be patterned (e.g., by photolithography and etching) into selector elements 130 after the bonding step. In these other alternative aspects of the fourth embodiment, the MTJ stack 150L may be patterned into the MTJ 150 before or after the bonding step. Thus, the MTJ 150 is not damaged during high temperature deposition of the stack of the selector-level layers 130L and vice-versa. Furthermore, the selector element 130 is not damaged during ion beam milling of the MTJ stack 150L if the MTJ stack 150L is patterned over a different substrate from the substrate supporting the stack of the selector-level layers 130L.

Figure 40:
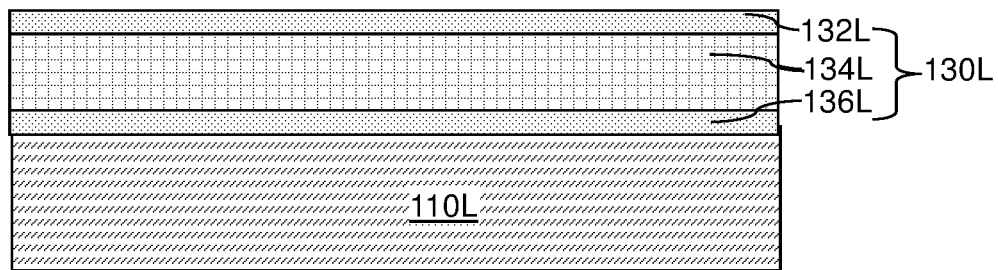
FIGS. 40, 41, 42, 43 and 44 are vertical cross-sectional views of steps in methods of forming other alternative configurations of the fourth exemplary structure according to other alternative aspects of the fourth embodiment of the present disclosure.
Figure 41:
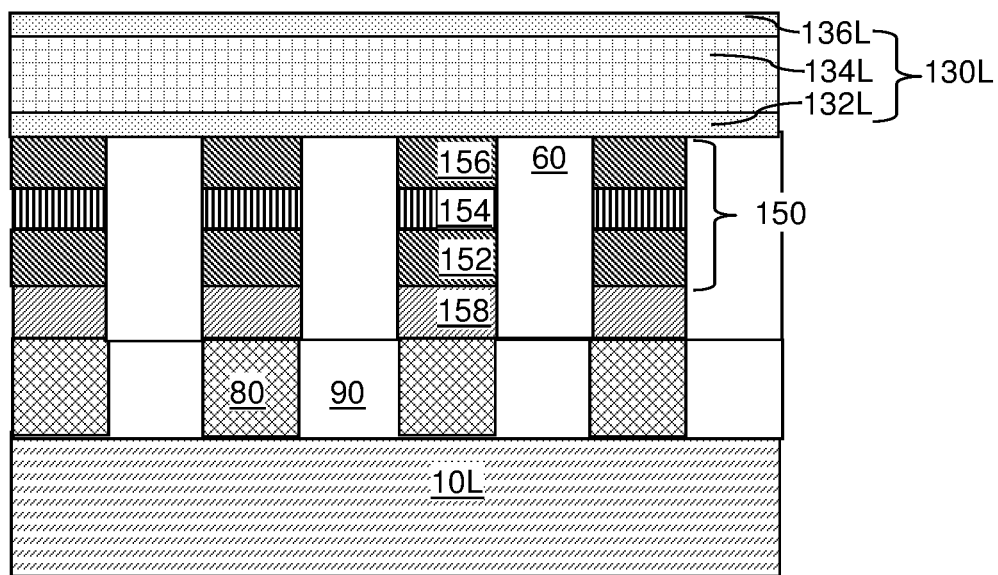
Figure 42:
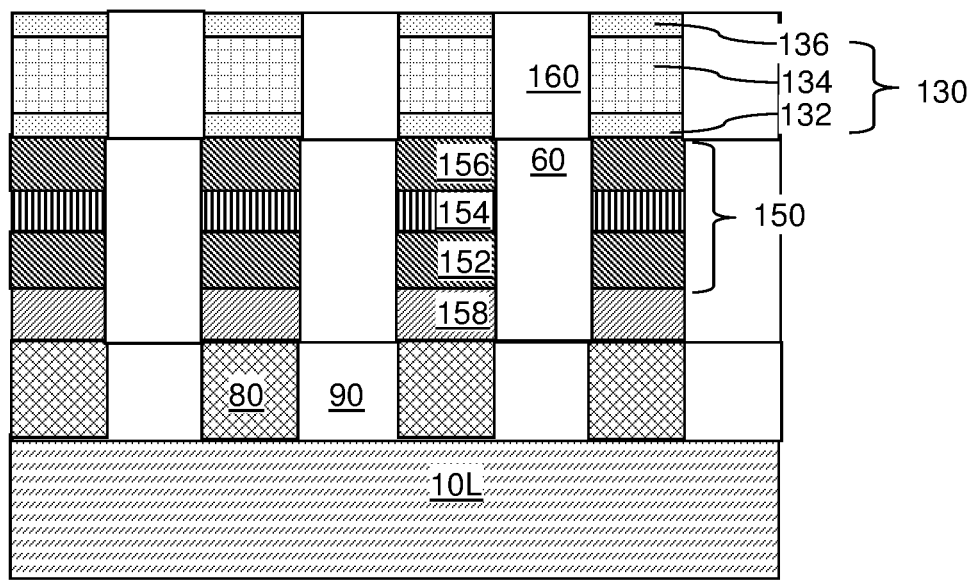

For example, the MTJ stack 150L may be patterned into the MTJ 150 before the bonding step, as shown in FIG. 37. The unpatterned stack of the selector-level layers 130L is provided over the second substrate 110L, as shown in FIG. 40. In this alternative aspect, the first electrically conductive lines 120 may be omitted from the second substrate 110L. The unpatterned stack of the selector-level layers 130L is then bonded to the MTJ 150 located over the first substrate 10L, as shown in FIG. 41. The second substrate 110L may be removed from the bonded assembly and the stack of the selector-level layers 130L is patterned (e.g., by photolithography and etching) into selector elements 130 after the bonding step. The dielectric isolation structure 160 is then formed to surround the selector elements 130, as shown in FIG. 42. The first electrically conductive lines 120 are then formed over the selector element 130, as described above.

Figure 43:
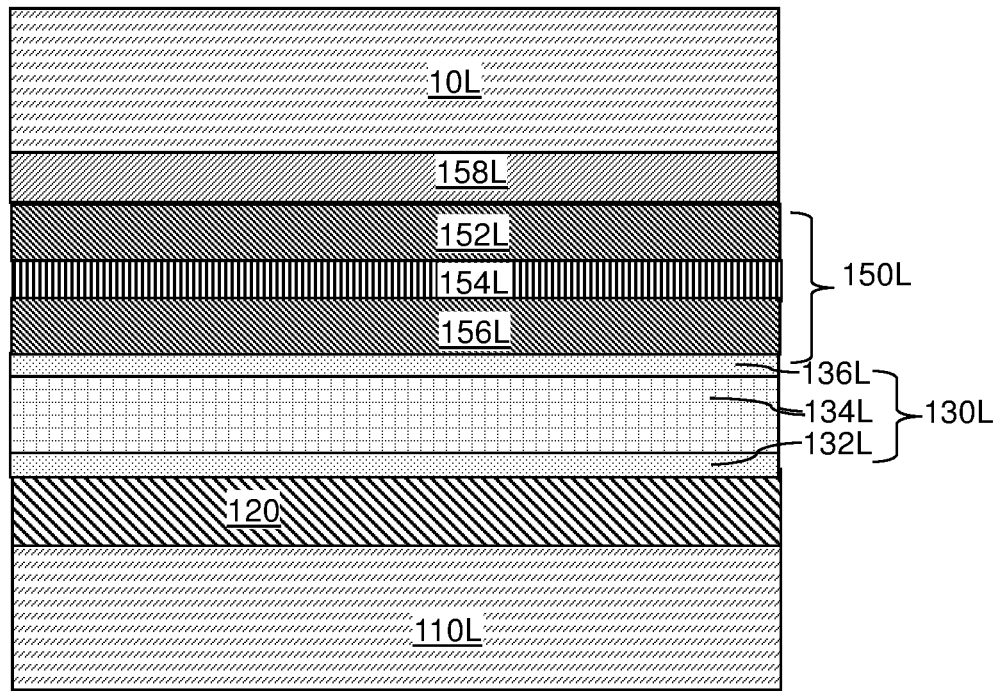
Figure 44:
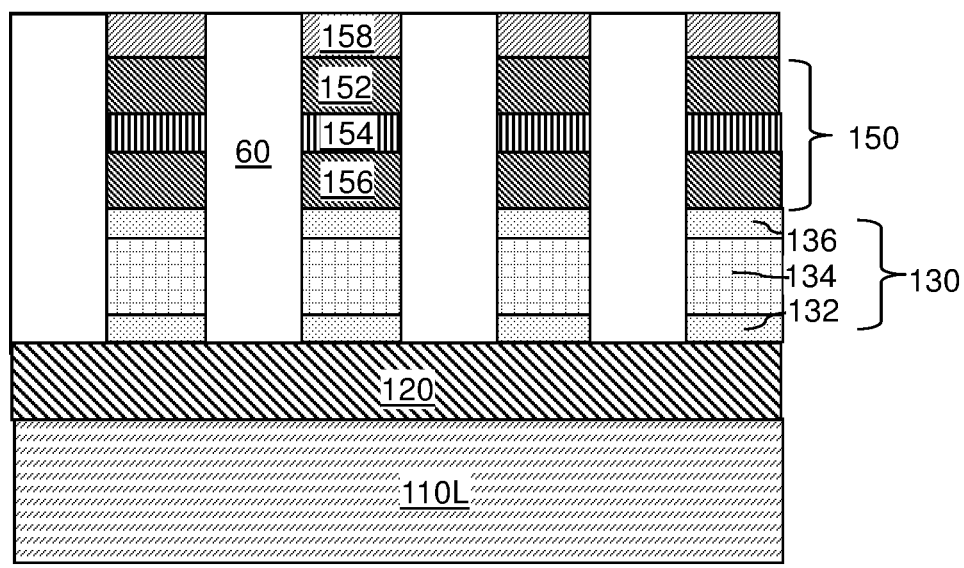

Alternatively, the MTJ stack 150L located over the first substrate 10L is bonded to the unpatterned stack of the selector-level layers 130L located over the first electrically conductive lines 120 over the first substrate 10L, as shown in FIG. 43. In this embodiment, the second electrically conductive lines 80 may be omitted from above the first substrate 10L. As shown in FIG. 44, the first substrate 10L may be removed from the bonded assembly. The MTJ stack 150L is patterned (e.g., by ion beam milling) into MTJs 150 and the stack of the selector-level layers 130L is patterned (e.g., by photolithography and etching) into selector elements 130 after the bonding step. If the MTJ stack 150L is patterned into the MTJs 150 after the bonding step, then the patterning of the stack of the selector-level layers 130L and the MTJ stack 150L may be carried out consecutively during a common patterning step using different etching or milling steps for each set of layers. The second electrically conductive lines 80 are then formed over the MTJ 150 as described above, to form the structure shown in FIG. 33.

The third and fourth embodiments provide a method of forming a memory device, such as a PCM or MRAM device, which comprises providing a first assembly comprising a first substrate 10L containing first electrically conductive lines comprising word lines or bit lines (e.g., 120 or 80), forming at least a portion of a memory cell (330, 150) over the first electrically conductive lines, providing a second assembly comprising a second substrate 110L containing second electrically conductive lines comprising other ones of word lines or bit lines (e.g., 80 or 120); and bonding the first assembly to the second assembly such that the memory cell is located between the first electrically conductive lines and the second electrically conductive lines. One of the first electrically conductive lines comprises a word line or bit line of the memory cell and one of the second electrically conductive lines comprises the other one of the word line or bit line of the memory cell.

The memory cell may be located in a memory pillar structure, which may also include a selector element 130 of the memory cell (330, 150) located in the memory pillar structure. The selector element 130 may comprise an ovonic threshold switch plate.

In the third embodiment illustrated in FIGS. 22-27, the memory device comprises the phase change memory (PCM) device, and the memory cell comprises a phase change memory cell comprising a phase change memory material plate 330. As discussed above, the method of the third embodiment includes forming selector-level layers 130L over a phase change material layer 330L located over electrically conductive lines 80 and the first substrate 10L, and patterning the selector-level layers 130L to form the selector element 130, and patterning the phase change material layer 30L to form the phase change material plate 330 prior to bonding the first assembly to the second assembly in which the selector element 130 is located between the electrically conductive lines 120 and the phase change material plate 330.

In the fourth embodiment, the memory device comprises a magnetoresistive random access memory (MRAM) device, and the memory cell comprises an MRAM memory cell comprising a magnetic tunnel junction (MTJ) 150 containing a tunnel barrier plate 154 located between a ferromagnetic reference plate 152 and a ferromagnetic free plate 156. As discussed above, the method of the fourth embodiment illustrated in FIGS. 28A-33 includes forming a MTJ stack 150L comprising a tunnel barrier layer 154L located between a ferromagnetic reference layer 152L and a ferromagnetic free layer 156L located over electrically conductive lines 90 and the first substrate 10, forming selector-level layers 130L over the MTJ stack 150L, and patterning the selector-level layers and the MTJ stack to form the selector element 130 and the MTJ 150. The step of bonding the first assembly to the second assembly occurs after forming the selector element and the MTJ.

As discussed above, an alternative method of the fourth embodiment illustrated in FIGS. 34-39 includes forming a MTJ stack 150L comprising a tunnel barrier layer 154L located between a ferromagnetic reference layer 152L and a ferromagnetic free layer 156L located over electrically conductive lines 80 and the first substrate 10L, patterning the MTJ stack to form the MTJ 150, forming selector-level layers 130L over the electrically conductive lines 120 located over the second substrate 110L, and patterning the selector-level layers to form the selector element 130. The step of bonding the first assembly to the second assembly occurs after forming the selector element 130 and forming the MTJ 150 such that the selector element is bonded to the MTJ.

According to the first, second and fourth embodiments, a method of forming a memory device, such as the FTJ or MRAM device, comprises providing a first assembly comprising at least a portion of a memory cell (30, 150) located over a first substrate 10L, providing a second assembly comprising at least a portion of a selector element 130 located over a second substrate 110L, and bonding the first assembly to the second assembly such that the memory cell is bonded to its respective selector element.

The memory cell and the selector element may be located in a memory pillar structure, and the selector element may comprise an ovonic threshold switch plate, as described above. The method may also include removing at least one of the first substrate 10L or the second substrate 110L after the step of bonding the second layer stack to the first layer stack.

In the first and second embodiments illustrated in FIGS. 1A to 21B, the memory device comprises a ferroelectric tunnel junction (FTJ) memory device and the memory cell comprises a ferroelectric material layer 30 located between first and second electrodes (40, 50).

In the fourth embodiment, the memory device comprises a magnetoresistive random access memory (MRAM) device and the memory cell comprises an MRAM memory cell comprising a magnetic tunnel junction (MTJ) 150 containing a tunnel barrier plate 154 located between a ferromagnetic reference plate 152 and a ferromagnetic free plate 156.

The method of one alternative aspect of the fourth embodiment illustrated in FIGS. 34 to 39 includes forming a MTJ stack 150L comprising a tunnel barrier layer 154L located between a ferromagnetic reference layer 152L and a ferromagnetic free layer 156L located over the first substrate 10L, patterning the MTJ stack 150L to form the MTJ 150 over the first substrate 10L, forming selector-level layers 130L over the second substrate 110L, and pattering the selector-level layers 130L to form the selector element 130 over the second substrate 110L. The step of bonding the first assembly to the second assembly occurs after forming the selector element 130 and forming the MTJ 150 such that the selector element is bonded to the MTJ.

The method of another alternative aspect of the fourth embodiment illustrated in FIGS. 40 to 42 includes forming a MTJ stack 150L comprising a tunnel barrier layer 154L located between a ferromagnetic reference layer 152L and a ferromagnetic free layer 156L located over the first substrate 10L, patterning the MTJ stack 150L to form the MTJ 150, forming selector-level layers 130L over the second substrate 110L, removing the second substrate 110L, and pattering the selector-level layers 130L to form the selector element 130 after removing the second substrate 110L. The step of bonding the first assembly to the second assembly occurs after forming MTJ 150 and before patterning the selector-level layers 130L such that the selector-level layers 130L are bonded to the MTJ 150.

The method of yet another alternative aspect of the fourth embodiment illustrated in FIGS. 43 to 44 includes forming a MTJ stack 150L comprising a tunnel barrier layer 154L located between a ferromagnetic reference layer 152L and a ferromagnetic free layer 156L located over the first substrate 10L, removing the first substrate 10L, forming selector-level layers 130L over the second substrate 110L, patterning the MTJ stack 150L to form the MTJ 150 and pattering the selector-level layers 130L to form the selector element 130 after removing the first substrate 10L. The step of bonding the first assembly to the second assembly occurs before patterning the MTJ stack 150L and before patterning the selector-level layers 130L such that the selector-level layers 130L are bonded to the MTJ stack 150L.

The stacked and bonded memory device of any embodiment of the present disclosure may be repeated multiple times in the vertical direction to obtain a stacked memory device with multiple memory cell levels between multiple word line levels and bit line levels. For example, a second memory cell level (130, 140, 40, 30, 24, 50) may be formed by bonding over the second lines 80 followed by providing additional first lines 120 over the second memory cell level. Three or more memory levels may also be formed by continuing the bonding process.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A memory device, comprising:
a first electrically conductive line laterally extending along a first horizontal direction;
a memory pillar structure overlying and contacting the first electrically conductive line, wherein the memory pillar structure comprises, from bottom to top:
a stack of a first metallic material plate consisting essentially of a first elemental metal and a second metallic material plate consisting essentially of a second elemental metal and bonded to the first metallic material plate at a bonding interface;

a single crystalline ferroelectric material plate comprising a ferroelectric dielectric metal oxide material having a first single crystalline crystal structure, and a single crystalline semiconductor plate comprising a semiconductor material having a second single crystalline crystal structure, wherein the second single crystalline crystal structure of the semiconductor material is in epitaxial alignment with the first single crystalline crystal structure of the ferroelectric dielectric metal oxide material at an interface between the semiconductor material and the ferroelectric dielectric metal oxide material; and a second electrically conductive line laterally extending along a second horizontal direction and overlying and contacting the memory pillar structure.

2. The memory device of claim 1, wherein:

the memory pillar structure further comprises a selector material plate underlying the first metallic material plate; and the bonding interface is located between the selector material plate and the single crystalline ferroelectric material plate.

3. The memory device of claim 2, further comprising:

a lower electrode plate contacting a bottom surface of the selector material plate and comprising a first non-metallic conductive material; and an upper electrode plate contacting a top surface of the selector material plate and comprising a second non-metallic conductive material.

4. The memory device of claim 3, wherein:

the selector material plate comprises an ovonic threshold switch material; and each of the first non-metallic conductive material and the second non-metallic conductive material is selected from amorphous carbon, amorphous boron-doped carbon, amorphous nitrogen-doped carbon, amorphous silicon, amorphous germanium, alloys thereof, or layer stacks thereof.

5. The memory device of claim 1, wherein the second metallic material plate contacts a bottom surface of the first metallic material plate.

6. The memory device of claim 5, wherein the second metallic material plate is not in direct contact with the first electrically conductive line.

7. The memory device of claim 1, wherein the ferroelectric material of the single crystalline ferroelectric material plate comprises doped or undoped hafnium oxide having an orthorhombic phase.

8. The memory device of claim 1, wherein the single crystalline semiconductor plate contacts an entirety of a top surface of the single crystalline ferroelectric material plate.

9. The memory device of claim 1, wherein the single crystalline semiconductor plate comprises single crystalline germanium or silicon germanium.

10. The memory device of claim 1, wherein the memory pillar structure comprises a metallic cap plate overlying the single crystalline ferroelectric material plate and contacting the second electrically conductive line.

11. The memory device of claim 1, wherein the memory pillar structure further comprises a selector material plate.

12. The memory device of claim 11, wherein the selector material plate comprises an ovonic threshold switch material.

13. The memory device of claim 1, wherein the memory pillar structure comprises straight sidewalls each vertically extending from the first electrically conductive line to the second electrically conductive line.

14. The memory device of claim 1, further comprising a dielectric isolation structure laterally surrounding and contacting the memory pillar structure.

* * * * *